(12) United States Patent
Shima

(10) Patent No.: US 8,106,467 B2
(45) Date of Patent: Jan. 31, 2012

(54) SEMICONDUCTOR DEVICE HAVING CARRIER MOBILITY RAISED BY GENERATING STRAIN IN CHANNEL REGION

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 254 days.

(21) Appl. No.: 11/429,310

(22) Filed: May 8, 2006

(65) Prior Publication Data

US 2007/0196972 A1   Aug. 23, 2007

(30) Foreign Application Priority Data

Feb. 22, 2006   (JP) ................ 2006-045738

(51) Int. Cl.
*H01L 31/119* (2006.01)
(52) U.S. Cl. ......... 257/410; 257/411; 257/412; 257/336
(58) Field of Classification Search .......... 257/410, 257/411, 412, 340–346, 387
See application file for complete search history.

(56) References Cited

U.S. PATENT DOCUMENTS

| | | | | |
|---|---|---|---|---|
| 5,783,475 A * | 7/1998 | Ramaswami | ............ | 438/303 |
| 5,972,804 A * | 10/1999 | Tobin et al. | ............ | 438/786 |
| 6,013,569 A * | 1/2000 | Lur et al. | ............ | 438/595 |
| 6,104,063 A * | 8/2000 | Fulford et al. | ............ | 257/344 |
| 6,188,117 B1 * | 2/2001 | Jan et al. | ............ | 257/413 |
| 6,495,900 B1 * | 12/2002 | Mouli et al. | ............ | 257/522 |
| 6,512,266 B1 * | 1/2003 | Deshpande et al. | ............ | 257/333 |
| 6,551,887 B2 * | 4/2003 | Kwon et al. | ............ | 438/305 |
| 6,946,371 B2 * | 9/2005 | Langdo et al. | ............ | 438/481 |
| 7,018,888 B2 * | 3/2006 | Goodlin et al. | ............ | 438/230 |
| 2003/0040158 A1 * | 2/2003 | Saitoh | ............ | 438/279 |
| 2005/0059228 A1 * | 3/2005 | Bu et al. | ............ | 438/595 |
| 2005/0116296 A1 * | 6/2005 | Yang | ............ | 257/369 |
| 2005/0116360 A1 * | 6/2005 | Huang et al. | ............ | 257/900 |

FOREIGN PATENT DOCUMENTS

| | | |
|---|---|---|
| JP | 2003-273240 | 9/2003 |
| JP | 2005-353675 | 12/2005 |

* cited by examiner

*Primary Examiner* — Steven Loke
*Assistant Examiner* — David Goodwin
(74) *Attorney, Agent, or Firm* — Fujitsu Patent Center

(57) ABSTRACT

A transistor is formed in the active region of a semiconductor substrate. A sidewall structure is disposed on the sidewalls of a gate electrode. A stress control film covers the semiconductor substrate. The sidewall structure includes a first portion extending along partial upper sidewalls of the gate electrode, a second portion extending from partial lower sidewalls of the gate electrode to partial surfaces of the active region, a third portion extending along partial surfaces of the first active region outer than the second portions, and a fourth portion facing the sidewalls of the gate electrode and an upper surface of the active region via the first to third portions. A Young's modulus of the first portion is lower than that of the third portion. The transistor is of an n-type and stress in the stress control film is tensile, or the transistor is of a p-type and stress is compressive.

16 Claims, 24 Drawing Sheets

5E — 5G — 5I — 5E

5S {5B, 5E}   5G   5I   5D {5E, 5B}

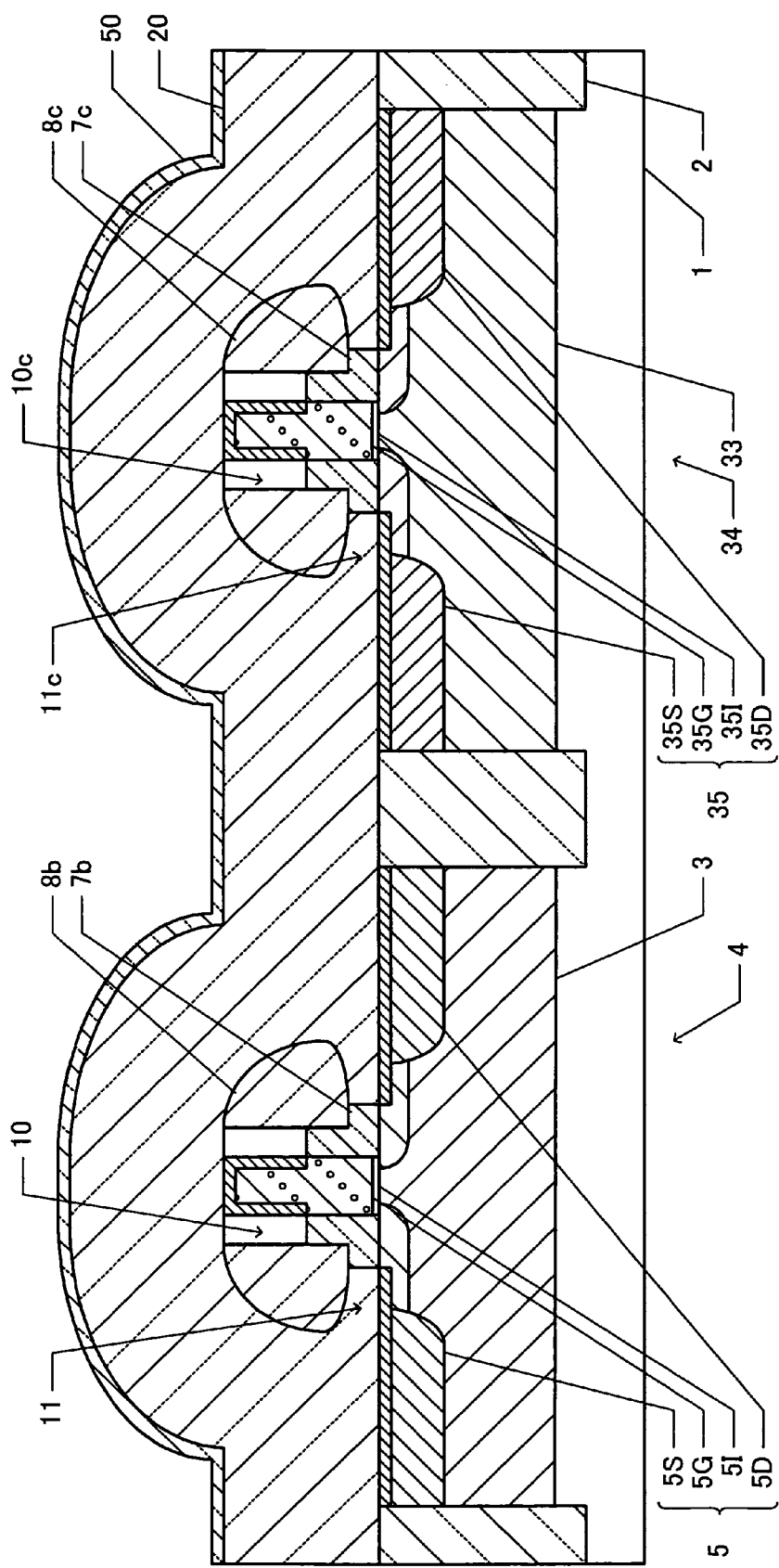

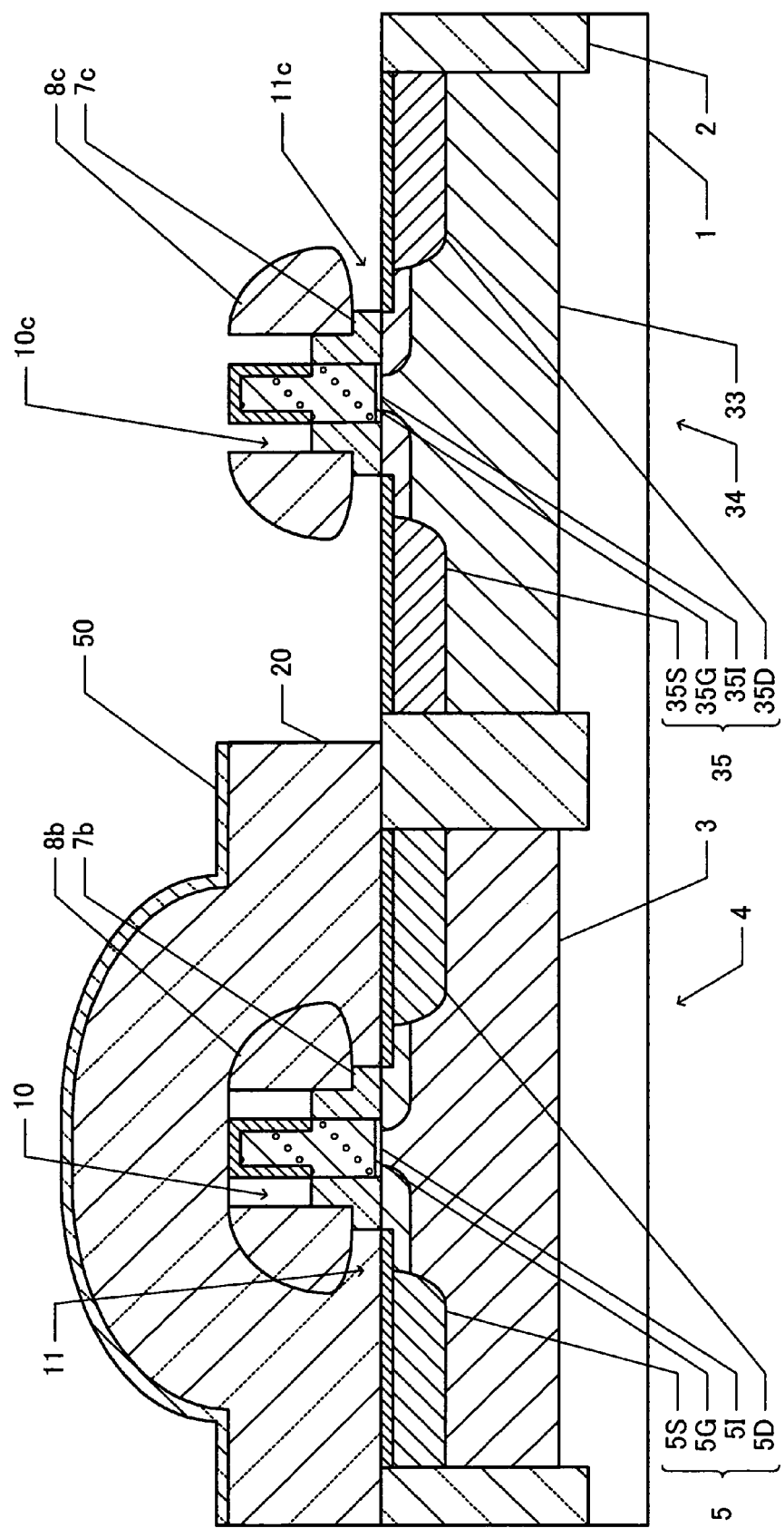

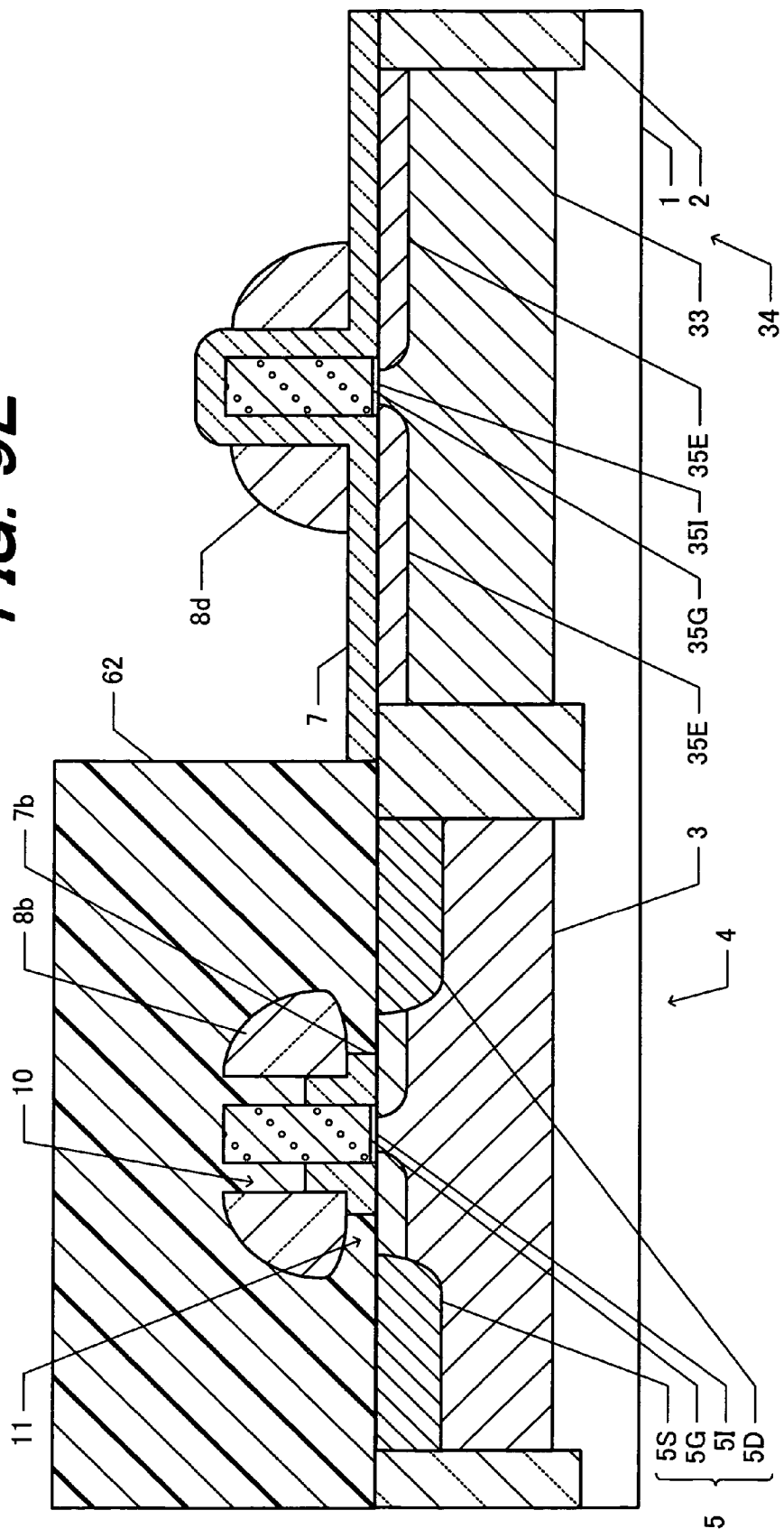

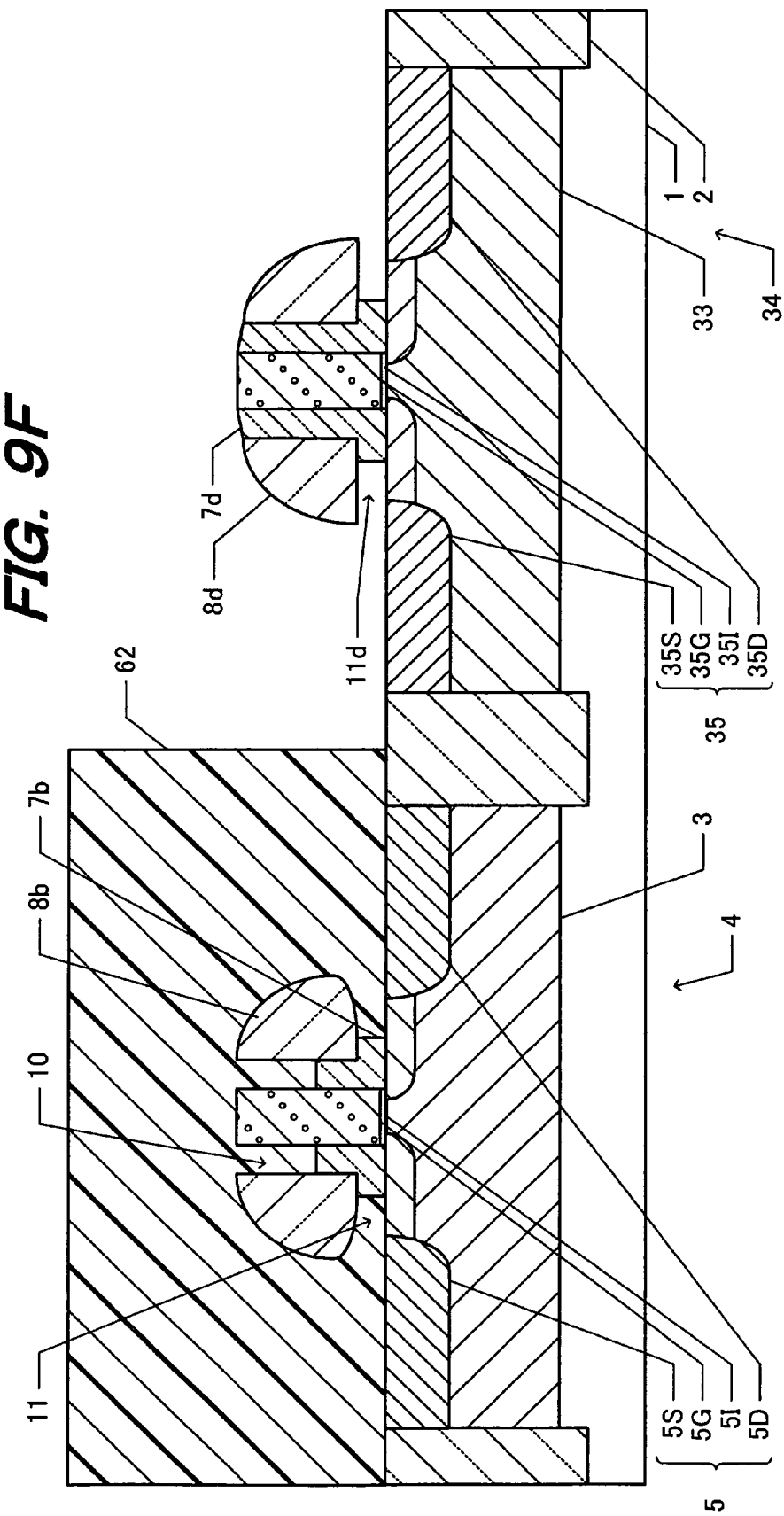

SEMICONDUCTOR DEVICE HAVING CARRIER MOBILITY RAISED BY GENERATING STRAIN IN CHANNEL REGION

CROSS REFERENCE TO RELATED APPLICATION

This application is based on and claims priority of Japanese Patent Application No. 2006-045738 filed on Feb. 22, 2006, the entire contents of which are incorporated herein by reference.

BACKGROUND OF THE INVENTION

A) Field of the Invention

The present invention relates to a semiconductor device and its manufacture method, and more particularly to a semiconductor device having a film for applying strain to a channel of a MIS transistor formed on the surface of a semiconductor substrate, and its manufacture method.

B) Description of the Related Art

Limitations are becoming imposed on miniaturization of a MIS transistor in conformity with scaling rules. Attention has been paid to techniques for raising a carrier mobility by introducing strain in a channel and changing the physical property of channel material. In a semiconductor device disclosed in JP-A-2003-273240, an NMOS transistor is covered with an insulating film accumulating tensile stress therein to induce tensile stress to the channel region, and a PMOS transistor is covered with an insulating film accumulating compressive stress therein to induce compressive stress to the channel region.

By applying the stress to the channel region, a mobility of carriers moving in the channel can be raised.

JP-A-2005-353675 discloses techniques of forming recesses in source and drain regions, burying a silicon nitride film accumulating stress therein in the recesses to thereby increase strain in the channel region. By increasing strain in the channel region, a carrier mobility can be raised further.

SUMMARY OF THE INVENTION

Sidewall spacers are generally disposed on the sidewalls of a gate electrode of a MIS transistor in order to form a lightly doped drain (LDD) structure.

If NMOS and PMOS transistors of a CMOS structure are covered with the same insulating film accumulating stress therein, a channel mobility of the transistor of one conductivity type is improved, whereas a channel mobility of the transistor of the other conductivity type is lowered.

An object of the present invention is to provide a semiconductor device having a structure that strain is produced efficiently in a channel region, and its manufacture method. Another object of the present invention is to provide a semiconductor device and its manufacture method capable of suppressing a channel mobility of a transistor of one conductivity type from being lowered when a channel mobility of a transistor of the other conductivity type is improved.

According to one aspect of the present invention, there is provided a semiconductor device comprising:
a semiconductor substrate defining a first active region of a first conductivity type;
a first transistor having a gate electrode disposed on the first active region and intersecting the first active region, a source region and a drain region of a second conductivity type opposite to the first conductivity type formed in a surface layer of the first active region on both sides of the gate electrode;
a first sidewall structure disposed on sidewalls of the gate electrode of the first transistor and on a surface of the first active region on both sides of the gate electrode; and
a first stress control film accumulating stress therein and covering the gate electrode of the first transistor, the first sidewall structure and the first active region,
wherein:
the first sidewall structure comprises a first portion extending along partial upper sidewalls of the gate electrode, a second portion extending from partial lower sidewalls of the gate electrode to partial surfaces of the first active region, a third portion extending along partial surfaces of the first active region outside the second portions, and a fourth portion facing the sidewalls of the gate electrode and an upper surface of the first active region across the first to third portions, and a Young's modulus of the first portion is lower than a Young's modulus of the third portion; and
the source and drain regions of the first transistor is an n-type and the stress in the first strain control film is tensile stress, or the source and drain regions of the first transistor is a p-type and the stress in the first strain control film is compressive stress.

According to another aspect of the present invention, there is provided a method of manufacturing a semiconductor device comprising steps of:

(a) forming a first gate electrode over a first active region of a first conductivity type defined on a surface of a semiconductor substrate, the first gate electrode intersecting the first active region;

(b) implanting impurities of a second conductivity type opposite to the first conductivity type into a surface layer of the first active region on both sides of the first gate electrode;

(c) forming a first film of insulating material, the first film covering surfaces of the first gate electrode and the semiconductor substrate;

(d) forming a second film on the first film, the second film being made of insulating material different from the insulating material of the first film;

(e) anisotropically etching the second film to leave a portion of the second film on sidewalls of the first gate electrode across the first film;

(f) etching the first film to leave a first sidewall structure on the sidewalls of the first gate electrode, the first sidewall structure comprising a portion of the first film and a portion of the second film;

(g) implanting impurities of the second conductivity type into the surface layer of the first active region on both sides of a convex portion constituted of the first gate electrode and the first sidewall structure;

(h) etching the first film constituting the first sidewall structure under a condition that the first film can be selectively etched relative to the first gate electrode, the second film and the surface layer of the first active region, to form first cavities by etching the first film from upper ends to intermediate depth positions thereof and second cavities by etching the first film from side ends to lateral intermediate positions thereof; and (i) forming a first stress control film accumulating stress therein on the semiconductor substrate and covering the first gate electrode and the first sidewall structure, under a condition that the first stress control film is embedded in the second cavities and not embedded in the first cavities, wherein the second conductivity type is an n-type and the stress in the first stress control film is tensile stress, or the second conductivity type is a p-type and the stress in the first stress control film is compressive stress.

According to still another aspect of the present invention, there is provided a method of manufacturing a semiconductor device comprising steps of:

(a) forming a first gate electrode over a first active region of a first conductivity type defined on a surface of a semiconductor substrate, the first gate electrode intersecting the first active region;

(b) implanting impurities of a second conductivity type opposite to the first conductivity type into a surface layer of the first active region on both sides of the first gate electrode;

(c) forming a first film of insulating material, the first film covering surfaces of the first gate electrode and the semiconductor substrate;

(d) forming a second film on the first film, the second film being made of insulating material different from the insulating material of the first film;

(e) anisotropically etching the second film to leave a portion of the second film on sidewalls of the first gate electrode across the first film, under a condition that the second film is selectively etched relative to the first film;

(f) etching the first film laterally from side edges of the second film being left on the sidewalls of the first gate electrode to form second cavities, and at the same time etching the first film deposited on the first gate electrode, under a condition that the first film is selectively etched relative to the first gate electrode and the second film; and (g) forming a first stress control film accumulating stress therein over the semiconductor substrate under a condition that the first stress control film is embedded in the second cavities, the first stress control film covering the first gate electrode and the second and first films left at the steps (e) and (f), wherein the first film has a Young's modulus lower than a Young's modulus of the first stress control film, and the second conductivity type is an n-type and the stress accumulated in the first stress control film is tensile stress, or the second conductivity type is a p-type and the stress accumulated in the first stress control film is compressive stress.

As the Young's modulus of the first portion is set lower than that of the third portion, the stress in the first stress control film can be induced efficiently in the channel region of the first transistor. If the first transistor is of an n-channel and tensile stress is accumulated in the first stress control film, the tensile stress can be induced efficiently in the channel region. In this case, tensile strain is generated in the channel region, so that a mobility of electrons moving in the channel region can be increased. Conversely, if the first transistor is of a p-channel and compressive stress is accumulated in the first stress control film, the compressive stress can be induced efficiently in the channel region. In this case, compressive strain is generated in the channel region, so that a mobility of holes moving in the channel region can be increased.

BRIEF DESCRIPTION OF THE DRAWINGS

FIGS. 8A to 8D are cross sectional views of a semiconductor device during manufacture in a semiconductor device manufacture method according to a fifth embodiment.

FIGS. 9A to 9G are cross sectional views of a semiconductor device during manufacture in a semiconductor device manufacture method according to a sixth embodiment.

DESCRIPTION OF THE PREFERRED EMBODIMENTS

Figure 1:
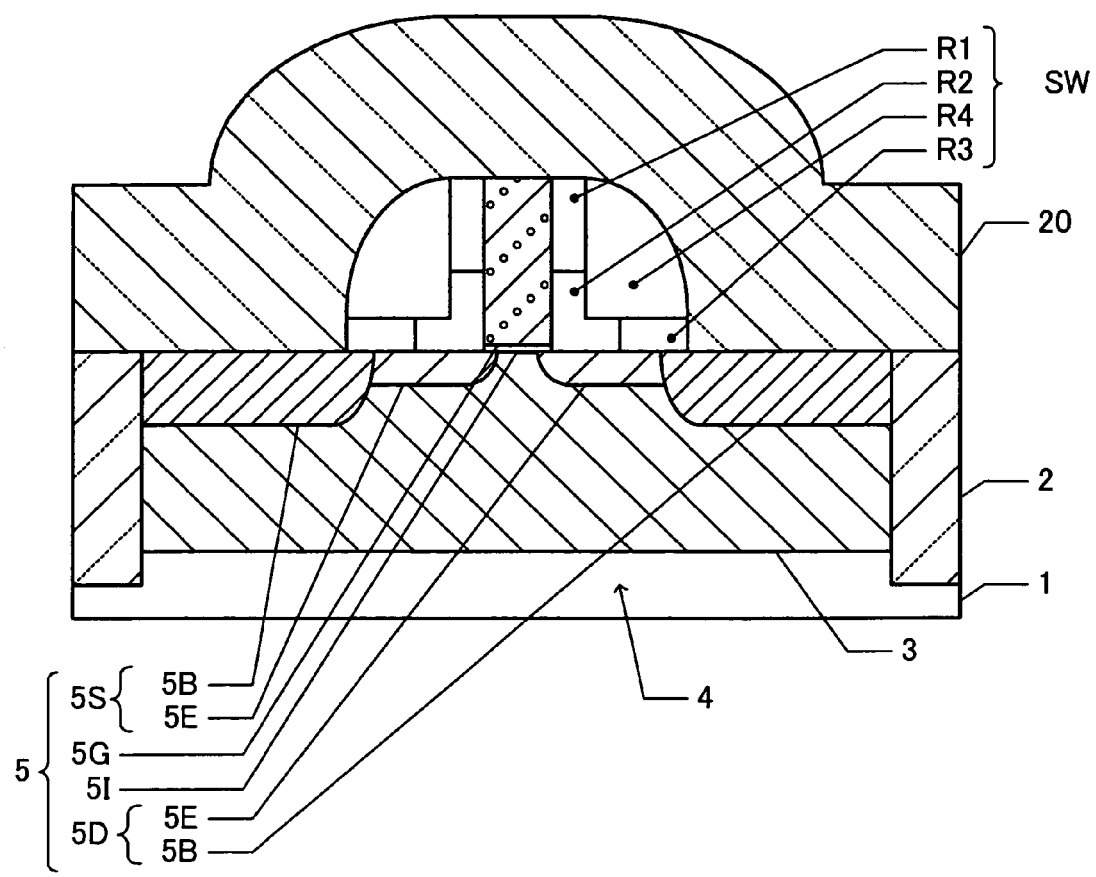
FIG. 1 is a cross sectional view of a semiconductor device according to a first embodiment.

FIG. 1 is a cross sectional view of a semiconductor device according to the first embodiment. An isolation insulating film 2 of a shallow trench isolation (STI) structure is formed in the surface layer of a semiconductor substrate 1 made of silicon, to define active regions 4. A well 3 of a first conductivity type is formed in a surface layer of the active region 4. A lamination structure of a gate insulating film 5I and a gate electrode 5G is disposed on the active region 4, intersecting the active region 4 in plan view. Extensions 5E of a second conductivity type opposite to the first conductivity type are formed in the surface layer of the active region 4 on both sides of the gate electrode 5G.

A sidewall structures SW are disposed on sidewalls of the gate electrode 5G and on the surfaces (mainly the upper surfaces of the extensions 5E) of the active region adjacent to the gate electrode 5G. Deep regions 5B of the second conductivity type are disposed in the surface layer of the active region 4 on both sides of a convex portion constituted of the gate electrode 5G and sidewall structures SW, the deep regions being deeper and having a higher concentration than the extensions 5E. One deep region 5B and one extension 5E continuous with this deep region constitute a source region 5S, and the other deep region 5B and the other extension 5E continuous with this deep region constitute a drain region 5D. A MIS transistor 5 with a second conductivity type channel is constituted of the source region 5S, drain region 5D, gate insulating film 5I and gate electrode 5G.

Each of the sidewall structures SW is constituted of four portions; a first portion R1 to fourth portion R4. The first portion R1 extends along an upper partial region of the sidewall of the gate electrode 5G. The second portion R2 extends along a region from a lower partial region of the sidewall of the gate electrode 5G to a partial surface region of the active region 4. The third portion R3 extends along a partial surface region of the active region 4 outside the second portion R2. The fourth portion R4 faces the sidewall of the gate electrode 5G and an upper surface of the active region 4, across the first to third portions R1 to R3.

A stress control film 20 is disposed covering the gate electrode 5G and sidewall structures SW of the transistor 5, and active region 4. Stress is accumulated in the stress control film 20.

Figure 2:
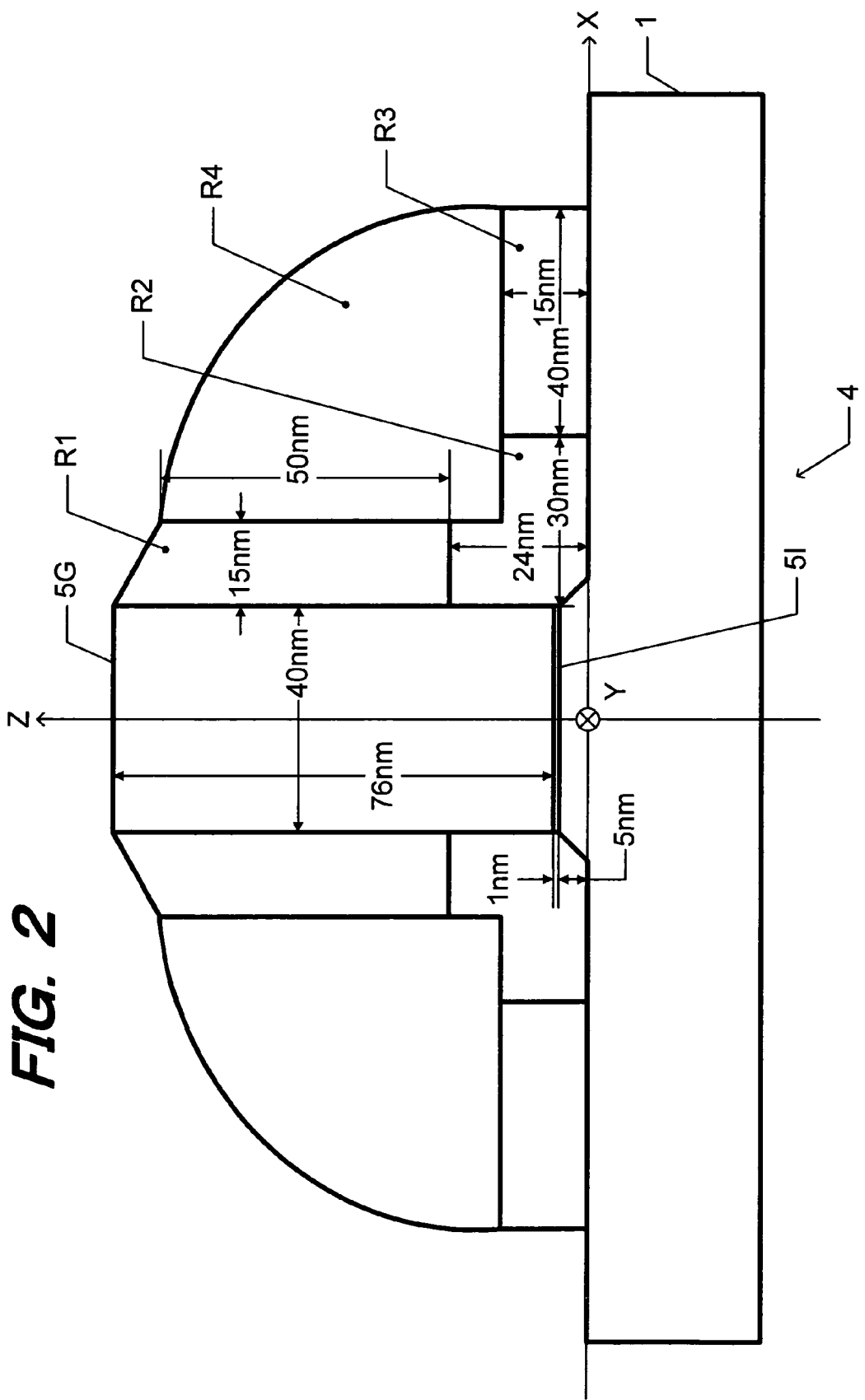
FIG. 2 is a chart showing the size of each region of the semiconductor device of the first embodiment.

With reference to FIGS. 2 to 4, description will be made on a result of a simulation of the intensity of stress and strain applied to the channel region of the transistor 5.

FIG. 2 shows the size of the transistor 5 and sidewall structures SW which are subjects for simulation. A thickness of the gate insulating film 5I is 1 nm, a height of the gate electrode 5G is 76 nm, and a gate length is 40 nm. The surface of the semiconductor substrate 1 on both sides of the gate electrode 5G is dug down by 5 nm from the bottom of the gate insulating film 5I. This lowered surface corresponds to that the substrate surface on both sides of the gate electrode 5G is etched thinly during etching for the gate electrode 5G. The advantageous effects of the first embodiment are hardly influenced by this lowered substrate surface on both sides of the gate electrode 5G. Simulation results similar to the results described below can be obtained even if the substrate surface under the gate electrode 5G is flush with the substrate surface on both sides of the gate electrode 5G.

An XYZ rectangular coordinate system is defined having the substrate surface on both sides of the gate electrode 5G as an XY plane and a gate length direction (motion direction of carriers) as an X-axis direction. An origin is a center of the gate electrode 5G along the gate length direction, and the normal direction to the substrate surface corresponds to a Z-axis.

A thickness of the first portion R1, second portion R2 and third portion R3 of each of the sidewall structures SW is 15 nm. A height from the XY plane to the upper end of each of the second portions R2 is 24 nm, and a height from this upper end to the upper end of each of the fourth portions R4 is 50 nm. A distance from each of the sidewalls of the gate electrode 5G to the side edge of corresponding second portion R2 is 30 nm, and a distance from this side edge to the side edges of corresponding third portion R3 and fourth portion R4 is 40 nm.

Six samples A to F were evaluated, the samples being made of a different combination of materials of the four portions of the sidewall structure SW. The following Table shows a combination of materials of the four portions of the sidewall structure SW of each sample.

TABLE 1

|   | R1 | R2 | R3 | R4 |
| --- | --- | --- | --- | --- |
| A | Cavity | $SiO_2$ | $SiO_2$ | SiN |
| B | Cavity | $SiO_2$ | SiN | SiN |
| C | $SiO_2$ | $SiO_2$ | $SiO_2$ | SiN |
| D | $SiO_2$ | $SiO_2$ | Cavity | SiN |
| E | SiN | $SiO_2$ | Cavity | SiN |
| F | $SiO_2$ | $SiO_2$ | $SiO_2$ | SiN |

In any of the samples, the semiconductor substrate 1 is made of single crystal silicon, the gate electrode 5G is made of polysilicon, and the stress control film 20 is made of SiN. In the simulation, Young's moduli of single crystal silicon, polysilicon, $SiO_2$ and SiN were set to 130 GPa, 160 GPa, 80 GPa and 250 GPa, respectively. Stress in the stress control film 20 is tensile stress, and its intensity was set to 1.0 GPa.

Figure 3A:
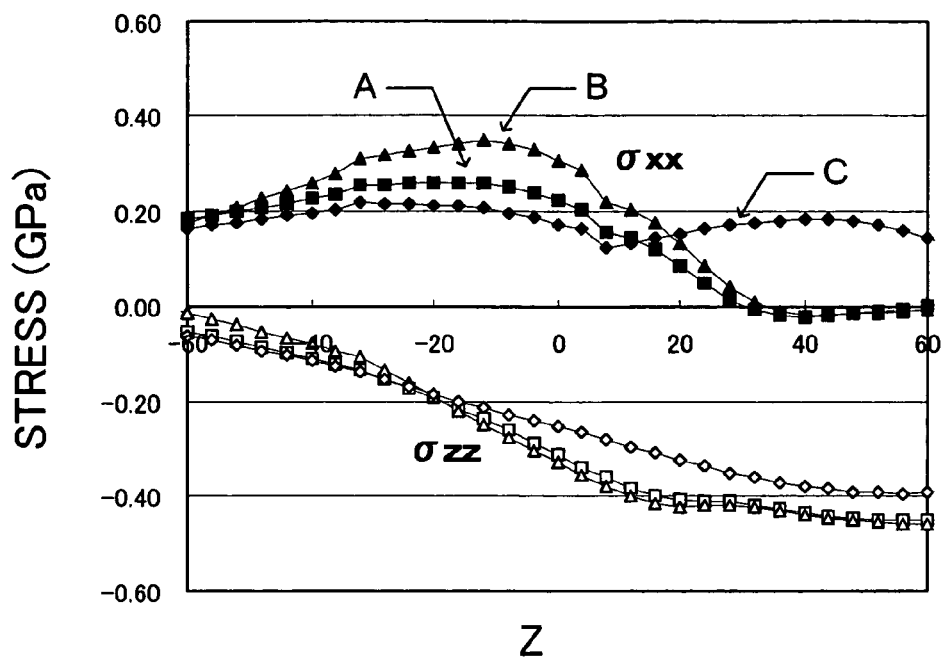
FIG. 3A is a graph showing a distribution of stress in the semiconductor device of the first embodiment.
Figure 3B:
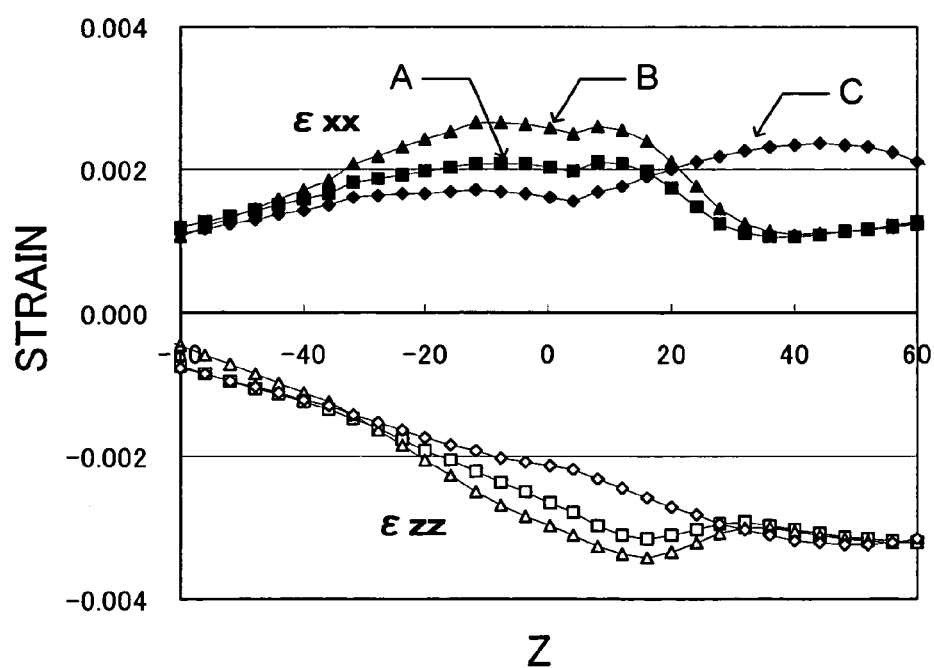
FIG. 3B is a graph showing a distribution of strain in the semiconductor device of the first embodiment.
Figure 4A:
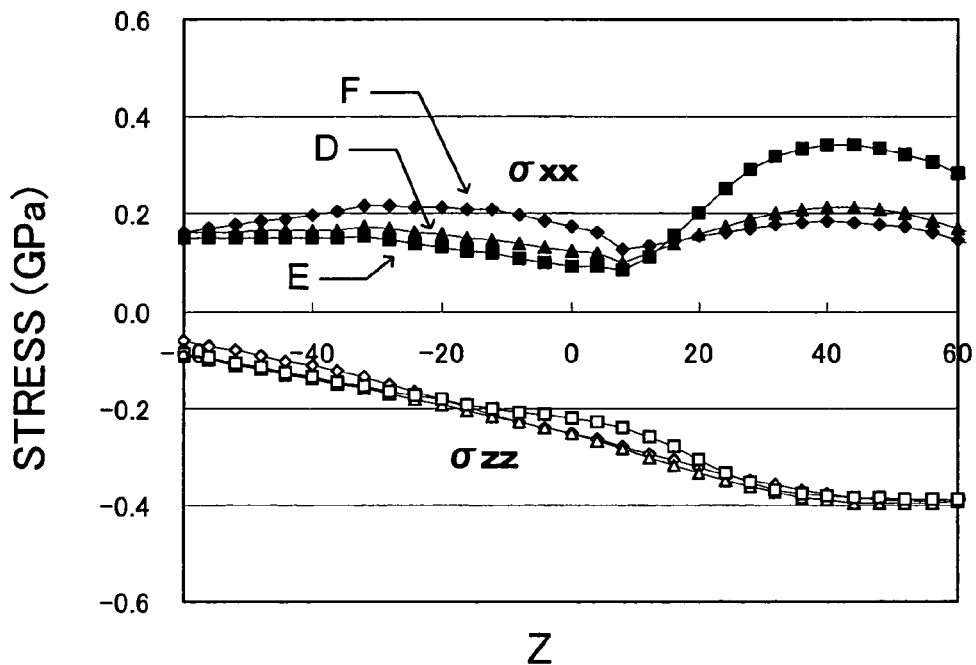
FIG. 4A is a graph showing a distribution of stress in the semiconductor device of the first embodiment.

FIG. 3A shows a distribution of stress of the samples A to C in the Z-axis direction at a position of X=0, and FIG. 3B shows a distribution of strain of the samples A to C in the Z-axis direction at a position of X=0. FIG. 4A shows a distribution of stress of the samples D to F in the Z-axis direction at a position of X=0, and FIG. 4B shows a distribution of strain of the samples D to F in the Z-axis direction at a position of X=0.

Figure 4B:
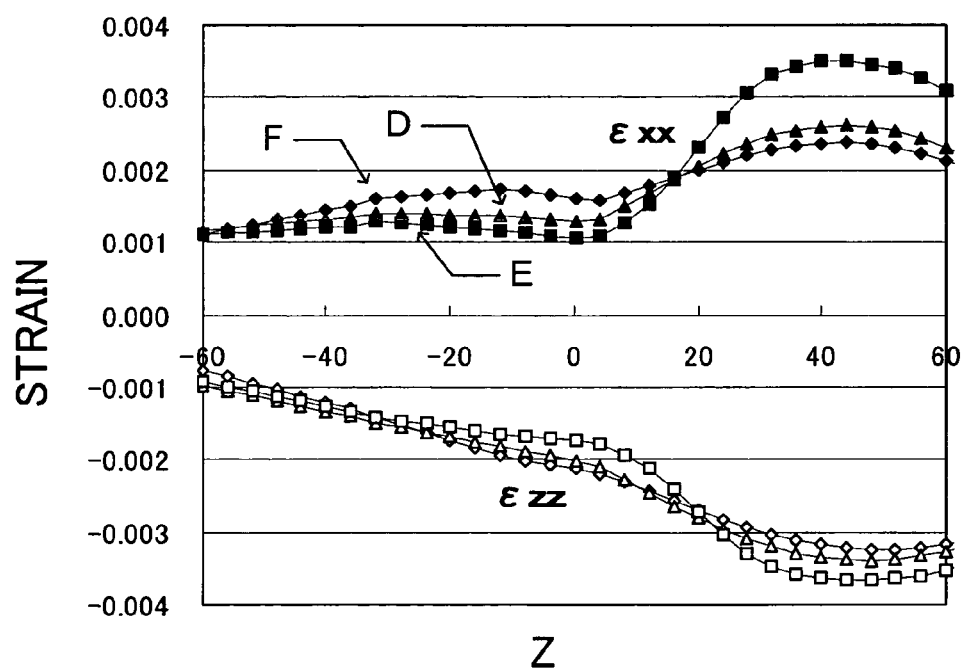
FIG. 4B is a graph showing a distribution of strain in the semiconductor device of the first embodiment.

The abscissa in FIGS. 3A to 4B represents the Z coordinates in the unit of "nm", the ordinate in FIGS. 3A and 4A represents strain in the unit of "GPa", and the ordinate in FIGS. 3B and 4B represents strain. Positive stress intends to tensile stress, and negative stress intends to compressive stress. Positive strain intends to tensile strain, and negative strain intends to compressive strain.

Square, triangle and rhomboid symbols in FIGS. 3A and 3B indicate simulation results of the samples A, B and C, respectively. Square, triangle and rhomboid symbols in FIGS. 4A and 4B indicate simulation results of the samples D, E and F, respectively. Black symbols in FIGS. 3A and 4A indicate stress $\sigma_{xx}$, and white symbols indicate strain $\sigma_{zz}$. Black symbols in FIGS. 3B and 4B indicate stress $\epsilon_{xx}$, and white symbols indicate strain $\epsilon_{zz}$. The distribution of strain shown in FIGS. 3B and 4B has a shape reflecting the shape of the distribution of stress shown in FIGS. 3A and 4A.

The position at the Z coordinates of 5 nm corresponds to the interface between the semiconductor substrate 1 and gate insulating film 5I. Namely, it can be considered that a channel is formed near Z=0 to 5 nm. A mobility of carriers transported in the channel largely depends upon the stress $\sigma_{xx}$. As the stress $\sigma_{xx}$ takes a large positive value, an electron mobility becomes high, and as the stress $\sigma_{xx}$ takes a large negative value, a hole mobility becomes high.

As shown in FIG. 3A, the stress $\sigma_{xx}$ in the channel region of the samples A and B is larger than the stress $\sigma_{xx}$ (in the channel region of the sample C. It can be understood from this evaluation result that the stress in the stress control film 20 can be induced efficiently in the channel region if the first portion R1 is a cavity. The first portion R1 of cavity can be considered as medium having a Young's modulus of 0 disposed in the first portion R1. Even if the first portion R1 is not a cavity, by setting the Young's modulus of the first portion R1 lower than those of the second portion R2, third portion R3 and fourth portion R4, it can be considered that stress can be induced more efficiently in the channel region than the sidewall structures SW are made of uniform material.

In the sidewall structure shown in FIG. 1, the second portion R2 has a function of supporting the fourth portion R4. Principally, the second portion R2 may be reduced to extend the first portion R1 to the lower end of the gate electrode 5G and extend the third portion R3 to the sidewall of the gate electrode 5G. In this case, it can be considered that a stress transmission efficiency is influenced by the magnitude of the Young's moduli of the first portion R1 and third portion R3. As this consideration is applied to the structure shown in FIG. 1, it can be understood that it is preferable to make the Young's modulus of the first portion R1 lower than that of the third portion R3 in order to enhance the stress transmission efficiency.

It can be understood from comparison between the samples A and B that the stress $\sigma_{xx}$ applied to the channel region of the sample B is larger than the stress $\sigma_{xx}$ applied to the channel region of the sample A. It can be understood from this evaluation result that the stress in the stress control film 20 can be induced efficiently in the channel region by setting the Young's modulus of the third portion R3 higher than that of the second portion R2.

If the source region 5S and drain region 5D shown in FIG. 1 are of an n-type, i.e., if the transistor is an n-channel transistor, it is preferable to induce tensile stress in the stress control film 20 and set the Young's modulus of the first portion R1 lower than that of the third portion R3. If the source region 5S and drain region 5D are of a p-type, i.e., if the transistor is a p-channel transistor, it is preferable to induce compressive stress in the stress control film 20 and set the Young's modulus of the first portion R1 lower than that of the third portion R3.

As shown in FIG. 4A, the stress $\sigma_{xx}$ in the channel region of the samples D and E is smaller than the stress $\sigma_{xx}$ in the channel region of the sample F. It can be understood from this evaluation result that the stress in the stress control film 20 can be suppressed from being induced in the channel region if the third portion R3 is a cavity. The third portion R3 of cavity can be considered as medium having a Young's modulus of 0 disposed in the third portion R3. Even if the third portion R3 is not a cavity, by setting the Young's modulus of the third portion R3 lower than those of the first portion R1, second portion R2 and fourth portion R4, it can be considered that stress can be suppressed more efficiently from being induced in the channel region compared to the case where the sidewall structures SW are made of uniform material. Considering the structure that the second portion R2 is reduced, it can be understood that the Young's modulus of the third portion R3 in particular is set lower than that of the first portion R1.

It can be understood from comparison between the samples D and E that the stress $\sigma_{xx}$ applied to the channel region of the sample E is smaller than the stress $\sigma_{xx}$ (applied to the channel region of the sample D. It can be understood from this evaluation result that the stress in the stress control film 20 can be suppressed from being induced in the channel region by setting the Young's modulus of the first portion R1 higher than that of the second portion R2.

In the simulation, although evaluation is conducted for the case wherein the stress control film 20 accumulates tensile stress therein, also in the case wherein the stress control film 20 accumulates compressive stress therein, a stress propagation efficiency has the same tendency as that of tensile stress.

If the source region 5S and drain region 5D shown in FIG. 1 are of an n-type, i.e., if the transistor is an n-channel transistor, and the stress control film 20 accumulates compressive stress therein, it is preferable to set the Young's modulus of the third portion R3 lower than that of the first portion R. In this manner, it is becomes possible to reduce compressive stress to be applied to the channel region and suppress the electron mobility from being lowered. If the source region 5S and drain region 5D are of a p-type, i.e., if the transistor is a p-channel transistor, and the stress control film 20 accumulates tensile stress therein, it is preferable to set the Young's modulus of the third portion R3 lower than that of the first portion R1. In this manner, it is becomes possible to reduce tensile stress to be applied to the channel region and suppress the hole mobility from being lowered.

Next, a semiconductor device manufacture method according to the second embodiment will be described with reference to FIGS. 5A to 5G.

Figure 5A:
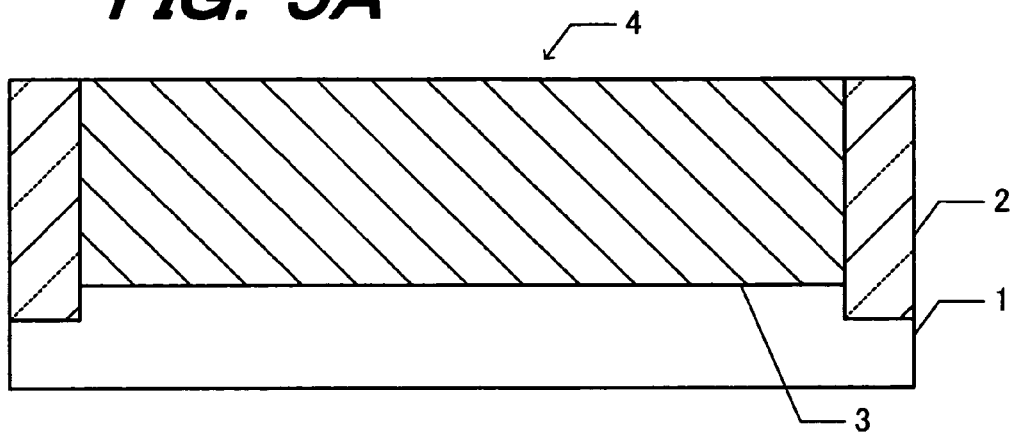
FIGS. 5A to 5H are cross sectional views of a semiconductor device during manufacture in a semiconductor device manufacture method according to a second embodiment.

As shown in FIG. 5A, an isolation insulating film 2 is formed by an STI method in a surface layer of a semiconductor substrate 1 made of p-type silicon. Active regions 4 are defined by the isolation insulating film 2. Impurities are implanted into a surface layer of the active region 4 to form a p-type well 3.

Figure 5B:
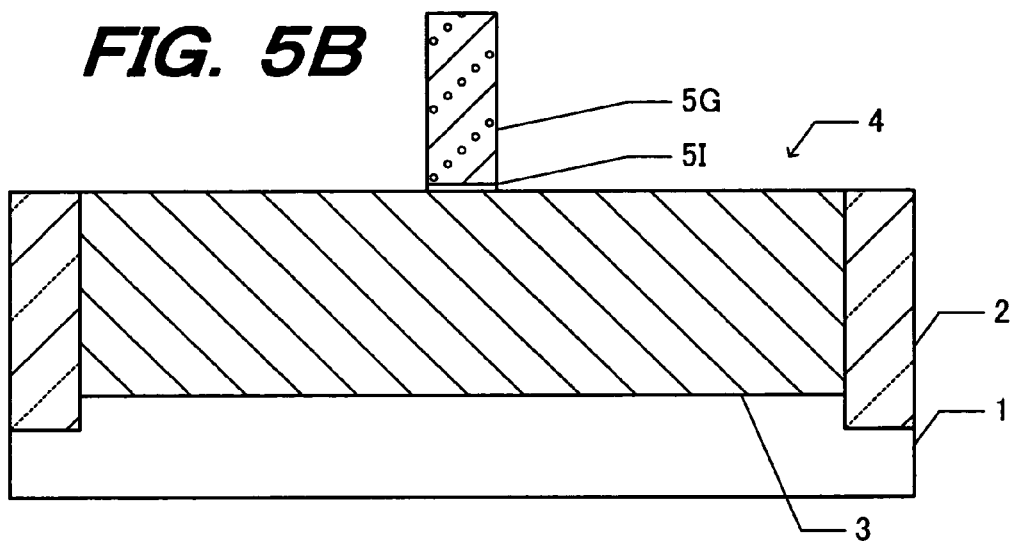

Processes up to the state shown in FIG. 5B will be described. The surface of the active region 4 is thermally oxidized and nitridized to form a silicon oxynitride (SiON) film having a thickness of 1 nm to be used for the gate insulating film 5I. Instead of the SiON film, the gate insulating film may be a silicon oxide film, a lamination of a silicon oxide film and a silicon nitride film, a lamination of a silicon oxide film and a high dielectric constant film such as an $HfO_2$ film, or the like. A polysilicon film having a thickness of 76 nm to be used for the gate electrode 5G is formed on the SiON film. Two layers of the polysilicon film and SiON film are patterned to leave the gate insulating film 5I and gate electrode 5G. The gate electrode 5G intersects the active region 4 in plan view.

Figure 5C:
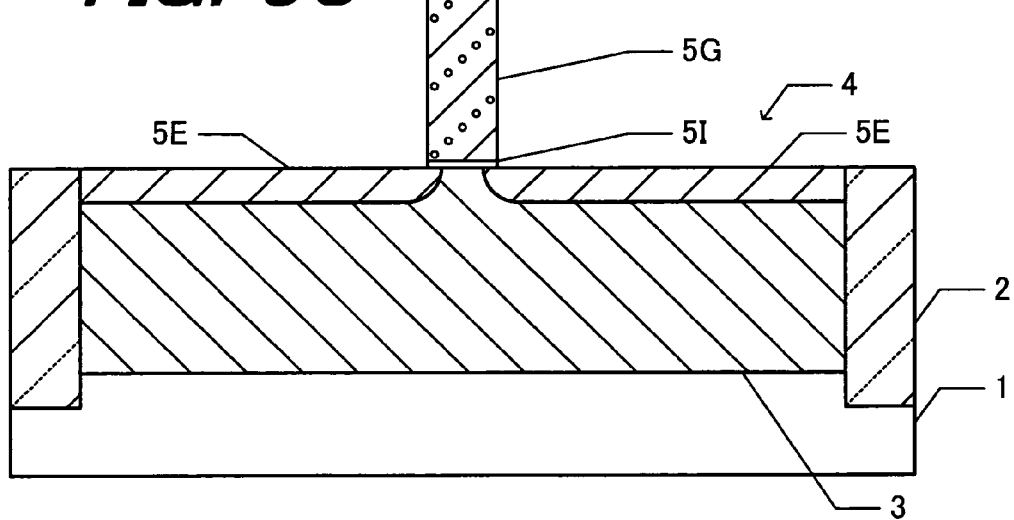

As shown in FIG. 5C, by using the gate electrode 5G as a mask, n-type impurities are implanted into the surface layer of the active region 4 on both sides of the gate electrode 5G to form extensions 5E for source and drain regions. If necessary, p-type impurities may be implanted to form pocket regions for preventing punch-through.

Figure 5D:
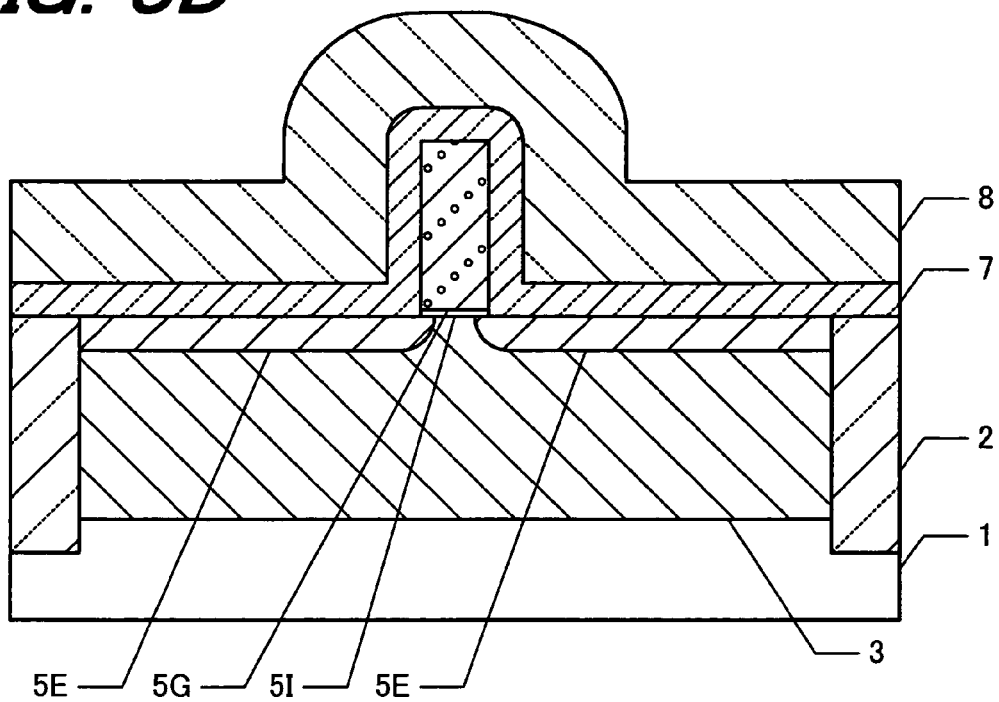

As shown in FIG. 5D, a first film 7 made of silicon oxide ($SiO_2$) and having a thickness of 15 nm is formed on the semiconductor substrate 1. A second film 8 made of silicon nitride (SiN) and having a thickness of 65 nm is formed on the first film 7. The first film 7 and second film 8 can be formed by chemical vapor deposition (CVD).

Figure 5E:
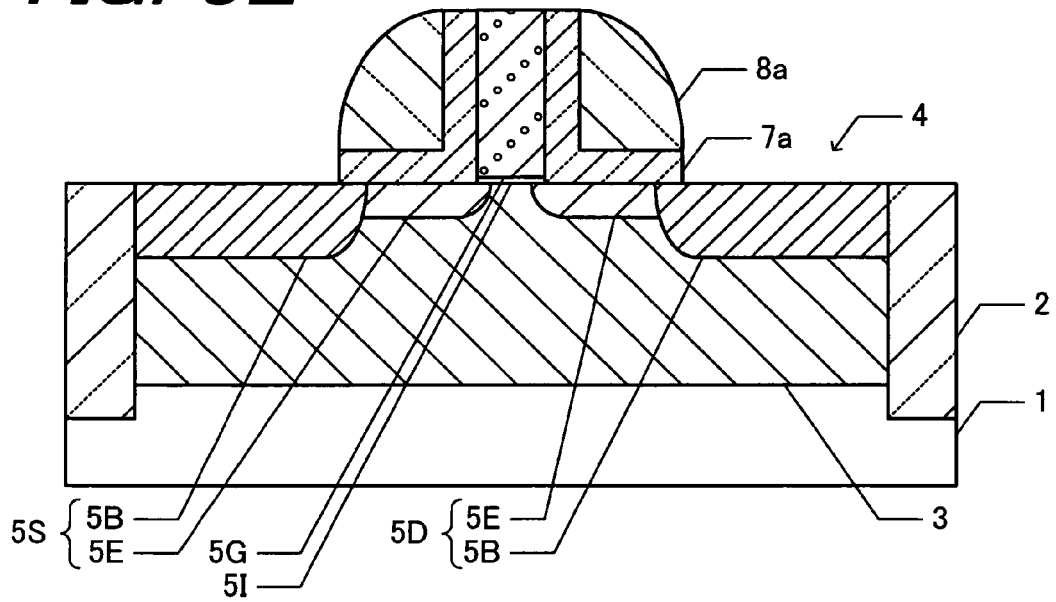

As shown in FIG. 5E, the first film 7 and second film 8 are anisotropically etched to leave a portion 7a of the first film 7 and a portion 8a of the second film 8 on the sidewalls of the gate electrode 5G. This anisotropic etching may be performed, for example, by dry etching using $CHF_3$ as etching gas under a pressure of 1 to 1000 Pa.

By using as a mask the gate electrode 5G and the first film 7a and second film 8a left on the sidewalls of the gate electrode 5G, p-type impurities are implanted into the surface layer of the active region 4 on both sides of the gate electrode 5G to form deep regions 5B deeper and having higher concentration than the extensions 5E. Annealing is performed to activate implanted impurity ions. A source region 5S and a drain region 5D are therefore formed, each being constituted of the deep region 5B and extension 5E.

Figure 5F:
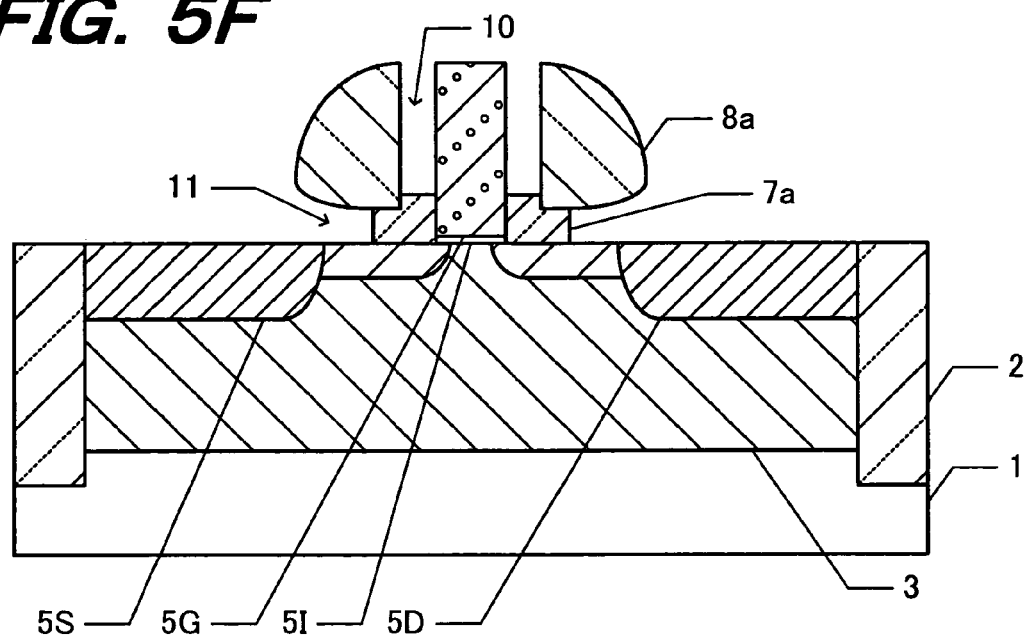

As shown in FIG. 5F, the first film 7a is isotropically etched under the condition that the first film 7a can be selectively etched relative to the gate electrode 5G, semiconductor substrate 1 and second film 8a. For example, this etching can be performed by dry etching using, as etching gas, fluorocaobon-based gas such as $C_4F_8$ mixed with oxygen, under a pressure of 1 to 1000 Pa. Then, the first film 7a is selectively and anisotropically etched. For example, this etching can be performed by dry etching using, as etching gas, fluorocaobon-based gas such as $C_4F_8$ under a pressure of 1 to 1000 Pa.

With these etching processes, the first film 7a is etched from its upper end to an intermediate height to form a first cavity 10, then the first film 7a is etched from its side edge to an intermediate lateral width to form a second cavity 11. While the first film 7a is etched laterally, the second film 8a is slightly etched in the opening portion of the second cavity 11 so that the opening portion is broadened. Since the anisotropical etching is performed following the isotropical etching, the cavity 10 is deeper than the cavity 11. Namely, an aspect ratio of the cavity 10 becomes large.

Figure 5G:
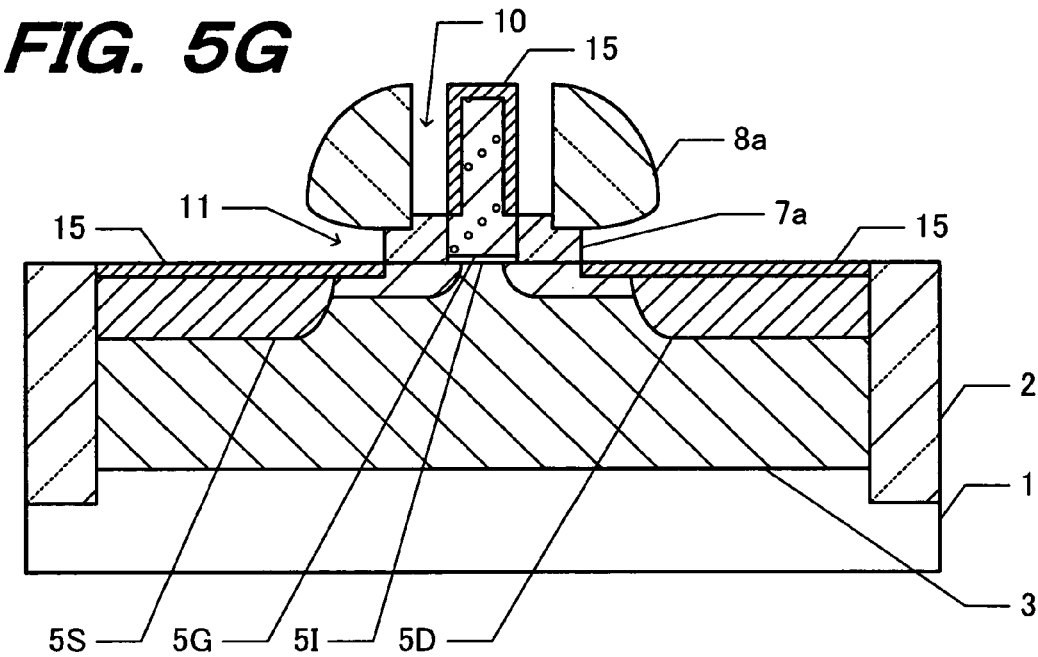

As shown in FIG. 5G, a metal silicide film 15 is formed on the surfaces of the source region 5S and drain region 5D and on the upper surface of the gate electrode 5G. For example, the metal silicide film 15 can be formed by depositing a Ni film, a Co film or the like on the substrate and performing heat treatment. After the heat treatment, an unreacted Ni film or Co film is removed.

Figure 5H:
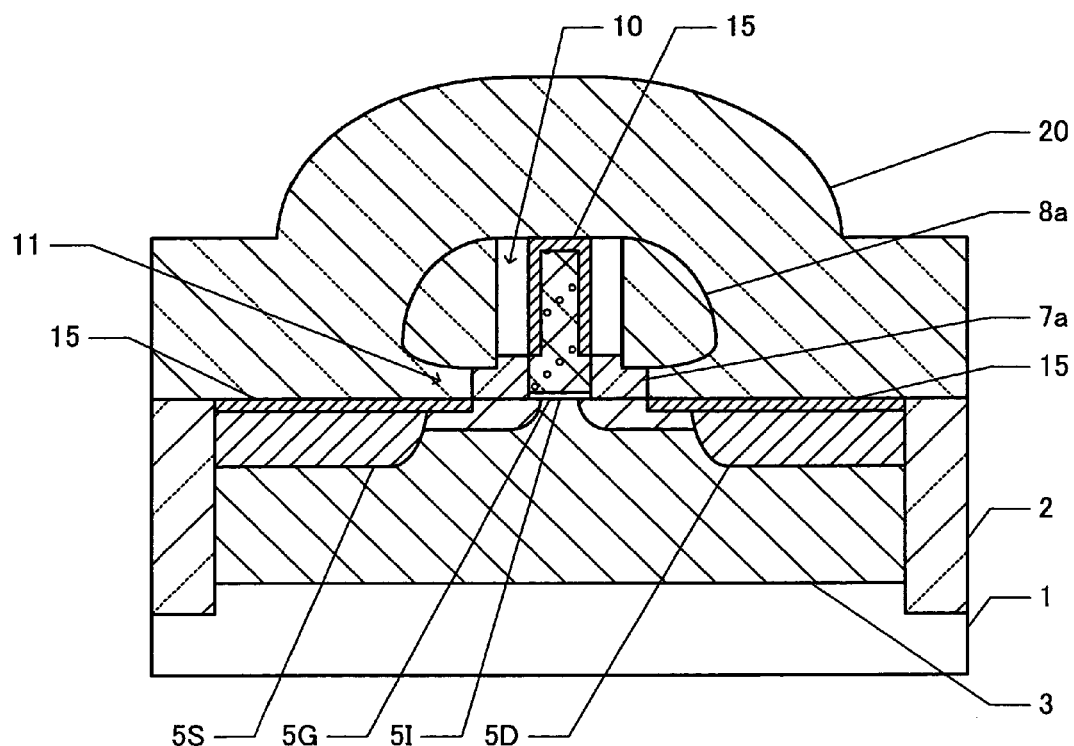

As shown in FIG. 5H, a stress control film 20 is formed by thermal CVD, the stress control film 20 accumulating tensile stress therein, made of silicon nitride (SiN) and having a thickness of 100 nm. The stress control film 20 is deposited under the condition that although the second cavity 11 is filled with SiN, the first cavity 10 is not filled with SiN. Since the opening portion of the second cavity 11 is broader than that of the first cavity 10, it is possible to find the condition that only the second cavity 11 is filled with SiN. For example, the conditions of forming the stress control film 20 accumulating tensile stress therein are as follows:

| | |
|---|---|
| Substrate temperature | 500 to 700° C. |
| Pressure | 13.3 Pa to $5.32 \times 10^4$ Pa |
| Mixed gas flow rate of $SiH_2Cl_2$ + $SiH_4$ + $Si_2H_4$ + $Si_2H_6$ | 5 to 50 sccm |
| $NH_3$ gas flow rate | 500 to 10000 sccm |
| Mixed gas flow rate of $N_2$ + Ar | 500 to 10000 sccm |

As the stress control film 20 is formed under the above-described conditions, tensile stress in the film is about 1.4 GPa.

Figure 5I:
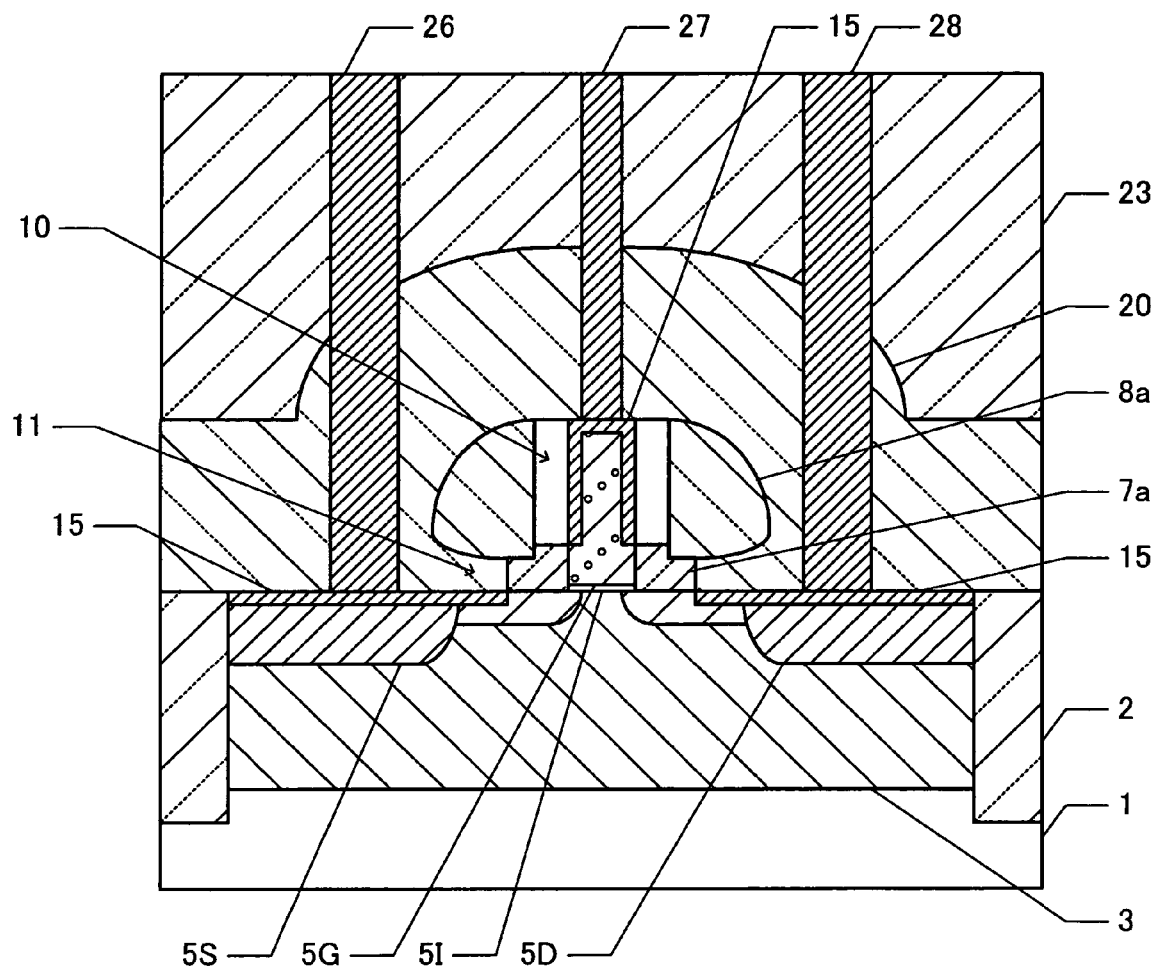
FIG. 5I is a cross sectional view of a semiconductor device of the second embodiment.

As shown in FIG. 5I, an interlayer insulating film 23 of silicon oxide or the like is formed on the stress control film 20. After the surface of the interlayer insulating film 23 is planarized, via holes are formed reaching the metal silicide films 15 formed on the upper surfaces of the source region 5S, gate electrode 5G and drain region 5D. While the via holes are formed through the interlayer insulating film 23, the stress control film 20 functions as an etching stopper. Conductive plugs 26, 27 and 28 of tungsten (W) are embedded in these via holes. The plugs 26, 27 and 28 are connected to the source region 5S, gate electrode 5G and drain region 5D, respectively.

The first cavity 10, the first film 7a, silicon nitride embedded in the second cavity 11 and the second film 8a correspond to the first portion R1, the second portion R2, the third portion R3 and the fourth portion R4 shown in FIG. 1, respectively. Since the first portion R1 is a cavity, tensile stress in the stress control film 20 is induced efficiently in the channel region of the n-channel transistor 5 and tensile stress is applied to the channel region in the in-plane direction. Characteristics of the transistor can therefore be improved.

Since the opening portion of the second cavity 11 is broadened by the process shown in FIG. 5G, an average thickness of the third portion R3 is thicker than an average thickness of the first portion R1.

In the second embodiment, although the n-channel transistor is manufactured, this manufacture method is applicable also to a p-channel transistor. In manufacturing a p-channel transistor, the well 3 is set to an n-type, and the source region 5S and drain region 5D are set to a p-type. In order to apply compressive stress to the channel region, a silicon nitride film accumulating compressive stress therein is used as the stress control film 20. The silicon nitride film accumulating compressive stress therein can be formed by plasma enhanced CVD. For example, the film forming conditions are as follows:

| | |
|---|---|
| Pressure | 13.3 Pa to $5.32 \times 10^4$ Pa |
| $SiH_4$ gas flow rate | 100 to 1000 sccm |
| $NH_3$ gas flow rate | 500 to 10000 sccm |
| Mixed gas flow rate of $N_2$ + Ar | 500 to 10000 sccm |
| RF power | 100 to 1000 W |

As the stress control film 20 is formed under the above-described conditions, compressive stress in the film is about 1.4 GPa.

Since the stress control film 20 accumulates compressive stress therein and the first portion R1 is a cavity, compressive stress can be applied efficiently to the channel region of the p-channel transistor. Characteristics of the p-channel transistor can therefore be improved.

Next, a semiconductor device manufacture method according to the third embodiment will be described with reference to FIGS. 6A to 6D. A first film 7 and a second film 8 are formed by the same processes as the processes up to the state shown in FIG. 5D of the semiconductor device manufacture method of the second embodiment.

Figure 6A:
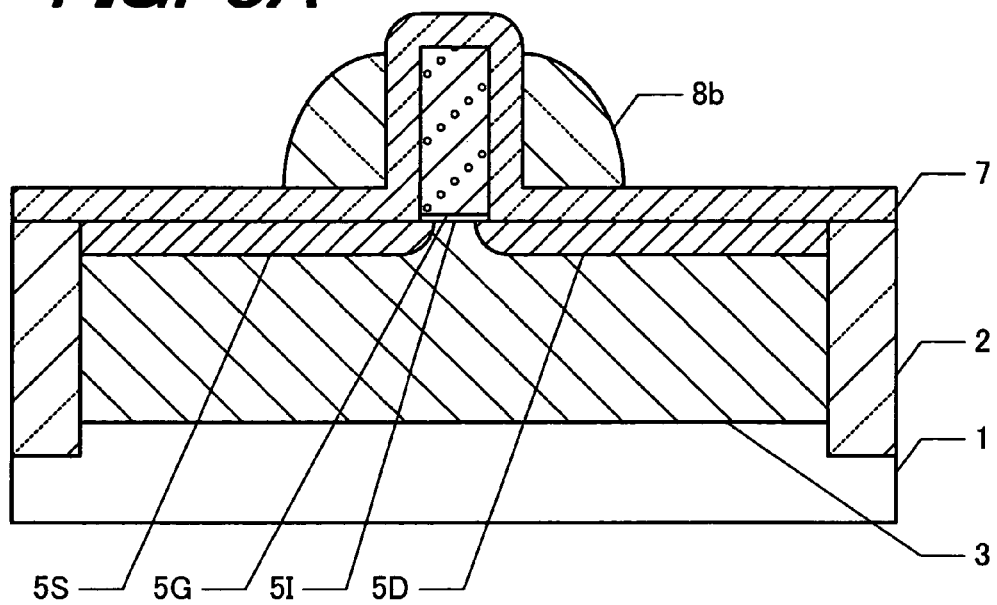
FIGS. 6A to 6C are cross sectional views of a semiconductor device during manufacture in a semiconductor device manufacture method according to a third embodiment.

As shown in FIG. 6A, the second film 8 is anisotropically etched under the condition that the second film 8 is selectively etched relative to the first film 7. A portion 8b of the second film 8 is therefore left on the sidewalls of the gate electrode 5G across the first film 7. The anisotropical etching of the second film 8 is performed, for example, by dry etching using fluorocaobon-based gas such as $CHF_3$ as etching gas.

Figure 6B:
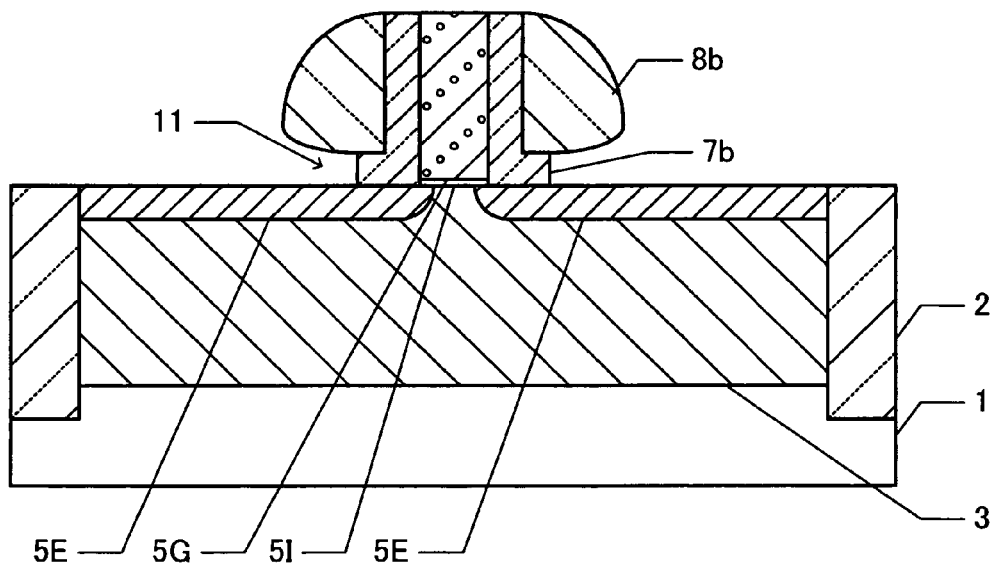

As shown in FIG. 6B, the first film 7 is isotropically etched under the condition that the first film 7 can be selectively etched relative to the gate electrode 5G, second film 8b and semiconductor substrate 1. This etching is stopped when the first film 7 deposited above the gate electrode 5G is removed and the upper surface of the gate electrode 5G is exposed. For example, this etching is performed by dry etching using, as etching gas, mixture gas of fluorocaobon-based gas such as $C_4F_8$ mixed with oxygen, under a pressure of 1 to 1000 Pa. The first film 7 is therefore laterally etched from the side edge of the second film 8b to form a second cavity 11. In this case, the second film 8b is also etched slightly and the opening portion of the second cavity 11 is broadened.

Figure 6C:
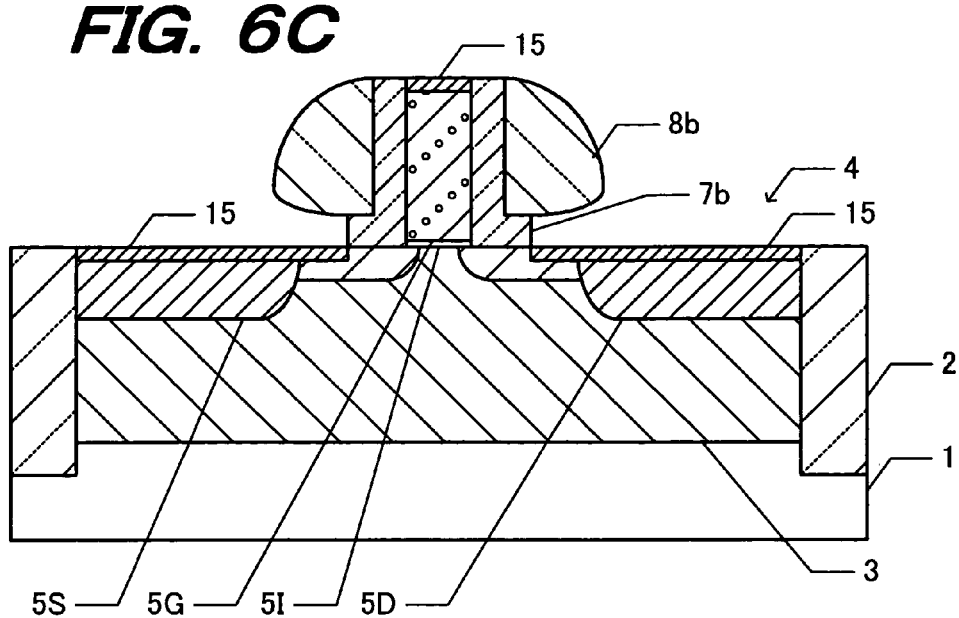

As shown in FIG. 6C, by using as a mask the gate electrode 5G, first film 7b and second film 8b, n-type impurities are implanted into the surface layer of the active region 4 on both sides of the mask. Deep regions of a source region 5S and a drain region 5D are therefore formed. A metal silicide film 15 is formed on the upper surfaces of the source region 5S, drain region 5D and gate electrode 5G.

Figure 6D:
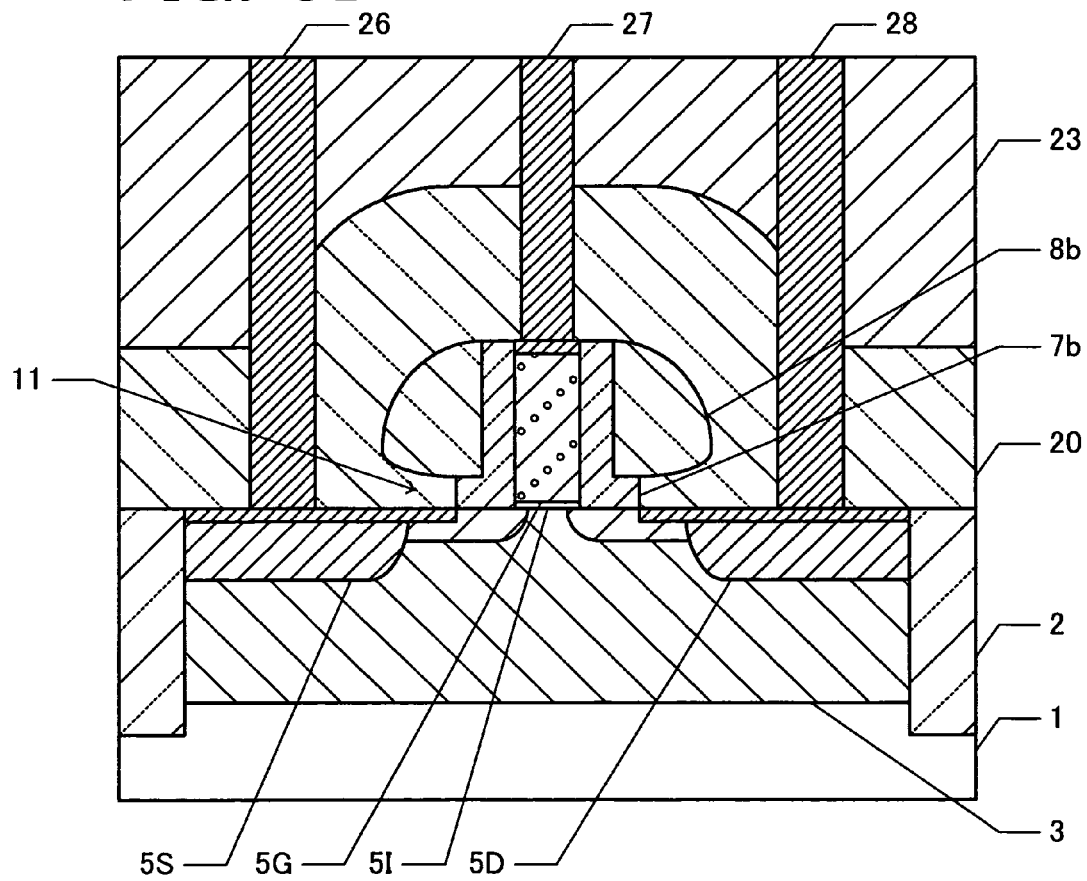
FIG. 6D is a cross sectional view of a semiconductor device of the third embodiment.

As shown in FIG. 6D, a stress control film 20 accumulating tensile stress therein is formed on the substrate. The stress control film 20 is embedded in the second cavities 11. An interlayer insulating film 23 and conductive plugs 26, 27 and 28 are formed by the same processes as those described with reference to FIG. 5I of the first embodiment.

In the third embodiment, the first film 7b left on the sidewalls of the gate electrode 5G corresponds to the first portion R1 and second portion R2 shown in FIG. 1, the stress control film 20 embedded in the second cavities 11 corresponds to the third portions R3, and the second film 8b corresponds to the fourth portion R4. The first portion R1 is made of silicon oxide and the third portion R3 is made of silicon nitride having a higher Young's modulus than that of silicon oxide. Therefore, as compared to the structure that the third portion R3 is made of silicon oxide, stress in the stress control film 20 can be induced more efficiently in the channel region.

A p-channel transistor can be manufactured by reversing the conductivity type of semiconductor regions and inducing compressive stress in the stress control film 20.

Next, a semiconductor device manufacture method according to the fourth embodiment will be described with reference to FIGS. 7A to 7D. A first film 7 and a second film 8b are formed by the same processes as the processes up to the state shown in FIG. 6A of the semiconductor device manufacture method of the third embodiment.

Figure 7A:
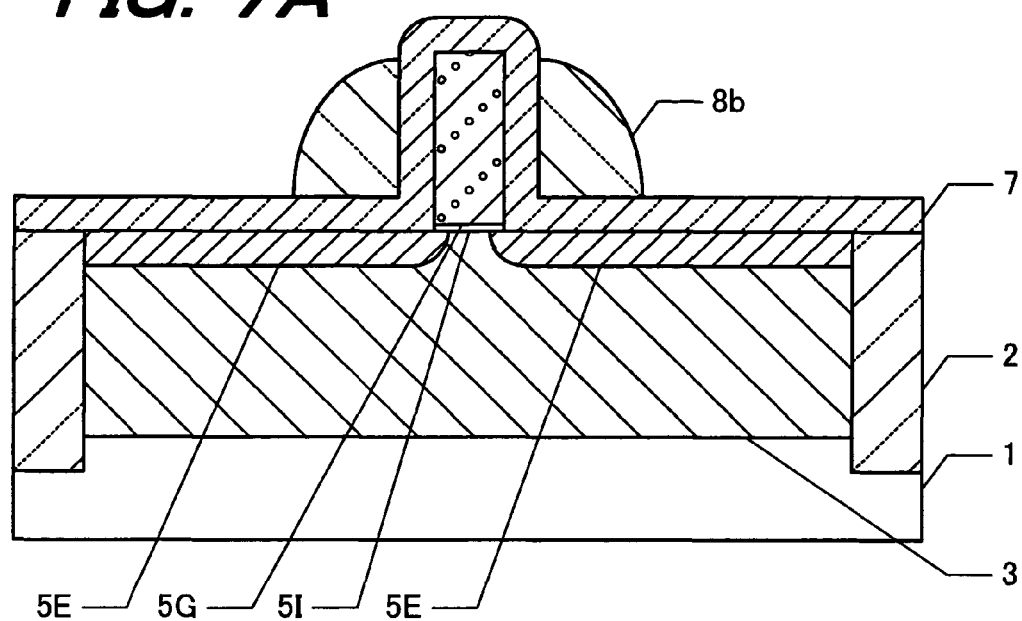
FIGS. 7A to 7C are cross sectional views of a semiconductor device during manufacture in a semiconductor device manufacture method according to a fourth embodiment.
Figure 7B:
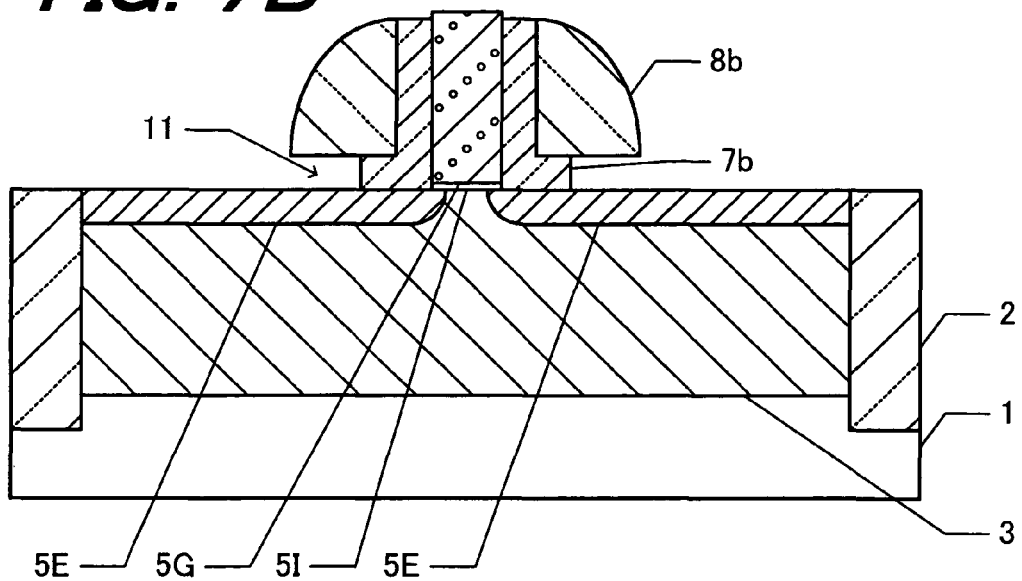

As shown in FIG. 7B, the first film 7 is isotropically etched under the condition that the first film 7 can be selectively etched relative to the gate electrode 5G, second film 8b and semiconductor substrate 1. The first film 7 is therefore laterally etched from the side edge of the second film 8b to form a second cavity 11. For example, this etching is performed by dry etching using, as etching gas, mixture gas of fluorocaobon-based gas such as $C_4F_8$ mixed with oxygen, under a pressure of 1 to 1000 Pa. In the fourth embodiment, an aspect ratio of the cavity 11 is made high by increasing an etching amount more than that of the process shown in FIG. 6B of the third embodiment. A stress control film to be deposited at a later process is difficult to enter the cavity 11. The first film 7 deposited on the gate electrode 5G is etched, so that the upper surface of the gate electrode 5G is exposed.

Figure 7C:
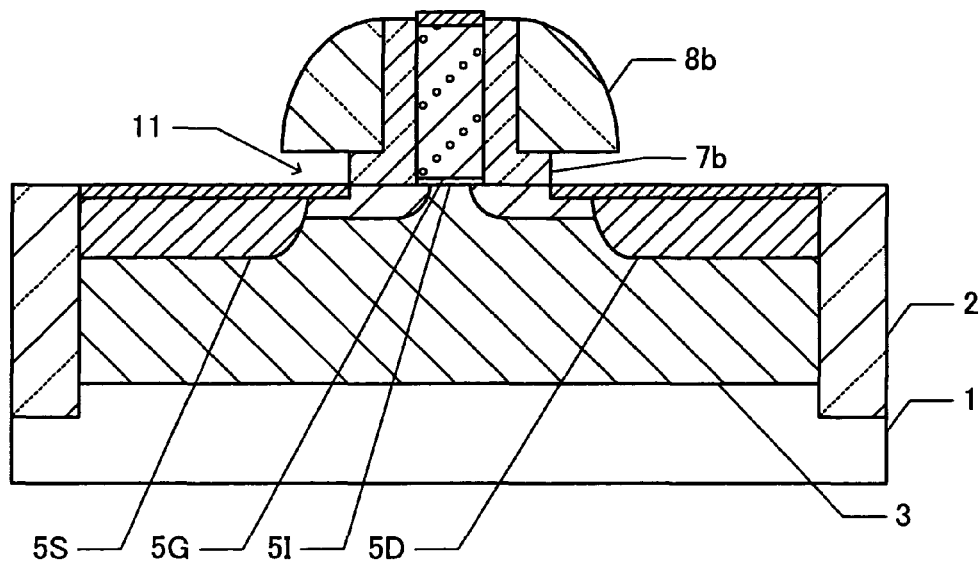

As shown in FIG. 7C, deep regions of a source region 5S and a drain region 5D are formed. A metal silicide film 15 is formed on the upper surfaces of the source region 5S, drain region 5D and gate electrode 5G.

Figure 7D:
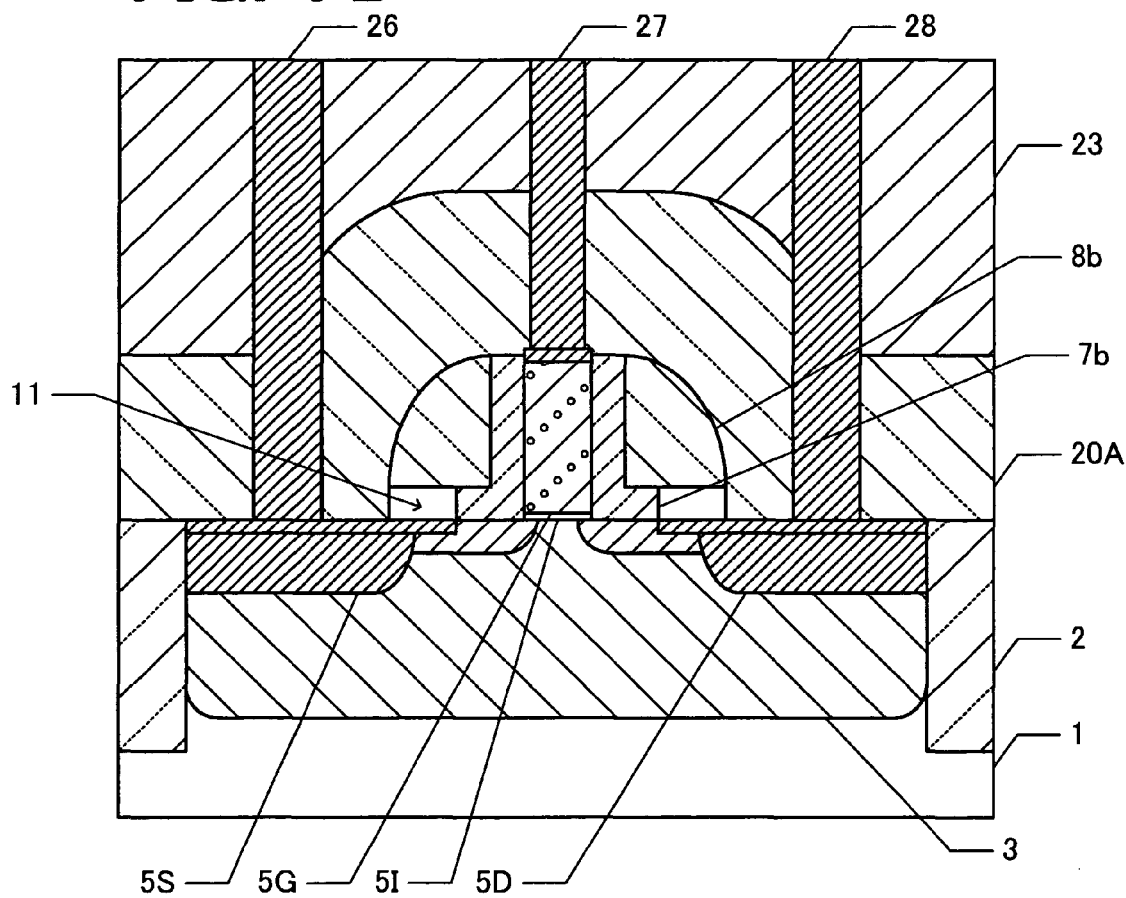
FIG. 7D is a cross sectional view of a semiconductor device of the fourth embodiment.

As shown in FIG. 7D, a stress control film 20A accumulating compressive stress therein is formed on the substrate. The stress control film 20A is not embedded in the second cavity 11. Since the opening portion of the second cavity 11 is not broadened, a film forming condition not embedding the stress control film 20A in the second cavity 11 can be found. An interlayer insulating film 23 and conductive plugs 26, 27 and 28 are formed by the same processes as those described with reference to FIG. 5I of the first embodiment.

In the fourth embodiment, the first film 7b left on the sidewalls of the gate electrode 5G corresponds to the first portion R1 and second portion R2 shown in FIG. 1, the second cavity 11 corresponds to the third portion R3, and the second film 8b corresponds to the fourth portion R4. Since the third portion R3 is a cavity, compressive stress in the stress control film 20A is hard to be induced in the channel region. It is therefore possible to reduce compressive stress to be applied to the channel region of the n-channel transistor. A channel mobility of the transistor can therefore be suppressed from being lowered.

An n-channel transistor can be manufactured by reversing the conductivity type of semiconductor regions and inducing tensile stress in the stress control film 20A.

Next, a semiconductor device manufacture method according to the fifth embodiment will be described with reference to FIGS. 8A to 8D.

As shown in FIG. 8A, an isolation insulating film 2 is formed in the surface layer of a semiconductor substrate 1 to define active regions 4 and 34. A p-type well 3 is formed in the surface layer of one active region 4, and an n-type well 33 is formed in the surface layer of the other active region 34. An n-channel transistor 5 is formed in the p-type active region 4 and a p-channel transistor 35 is formed in the n-type active region 34. The n-channel transistor 5 has the same structure as that of the n-channel transistor of the second embodiment shown in FIG. 5I. The p-channel transistor 35 has a source region 35S, a drain region 35D, a gate insulating film 35I and a gate electrode 35G.

A first film 7c, a second film 8c and a first cavity 10c are disposed on both sides of the gate electrode 35G. The first film 7c, second film 8c and first cavity 10c have the same geometric shape as that of the first film 7b, second film 8b and first cavity 10 disposed on both sides of the gate electrode 5G of the n-channel transistor 5.

A stress control film 20 made of silicon nitride accumulating tensile stress therein and having a thickness of 100 nm is formed covering the whole surface of the substrate. The side edge of the first film 7b is retracted from the side edge of the second film 8b of the n-channel transistor 5, and the stress control film 20 is embedded in this retracted region 11. Similarly, the side edge of the first film 7c is retracted from the side edge of the second film 8c of the p-channel transistor 35, and the stress control film 20 is embedded in this retracted region 11c.

An etching stopper film 50 made of silicon oxide and having a thickness of 10 nm is formed on the stress control film 20.

As shown in FIG. 8B, the stress control film 20 and etching stopper film 50 above the active region 34 formed with the p-channel transistor 35 are removed, whereas the stress control film 20 and etching stopper film 50 above the active region 4 formed with the n-channel transistor 5 are left. Second cavities 11c appear between the second films 8c and the substrate surface. First cavities 10c remain between the gate electrode 35G and second films 8c.

Figure 8C:
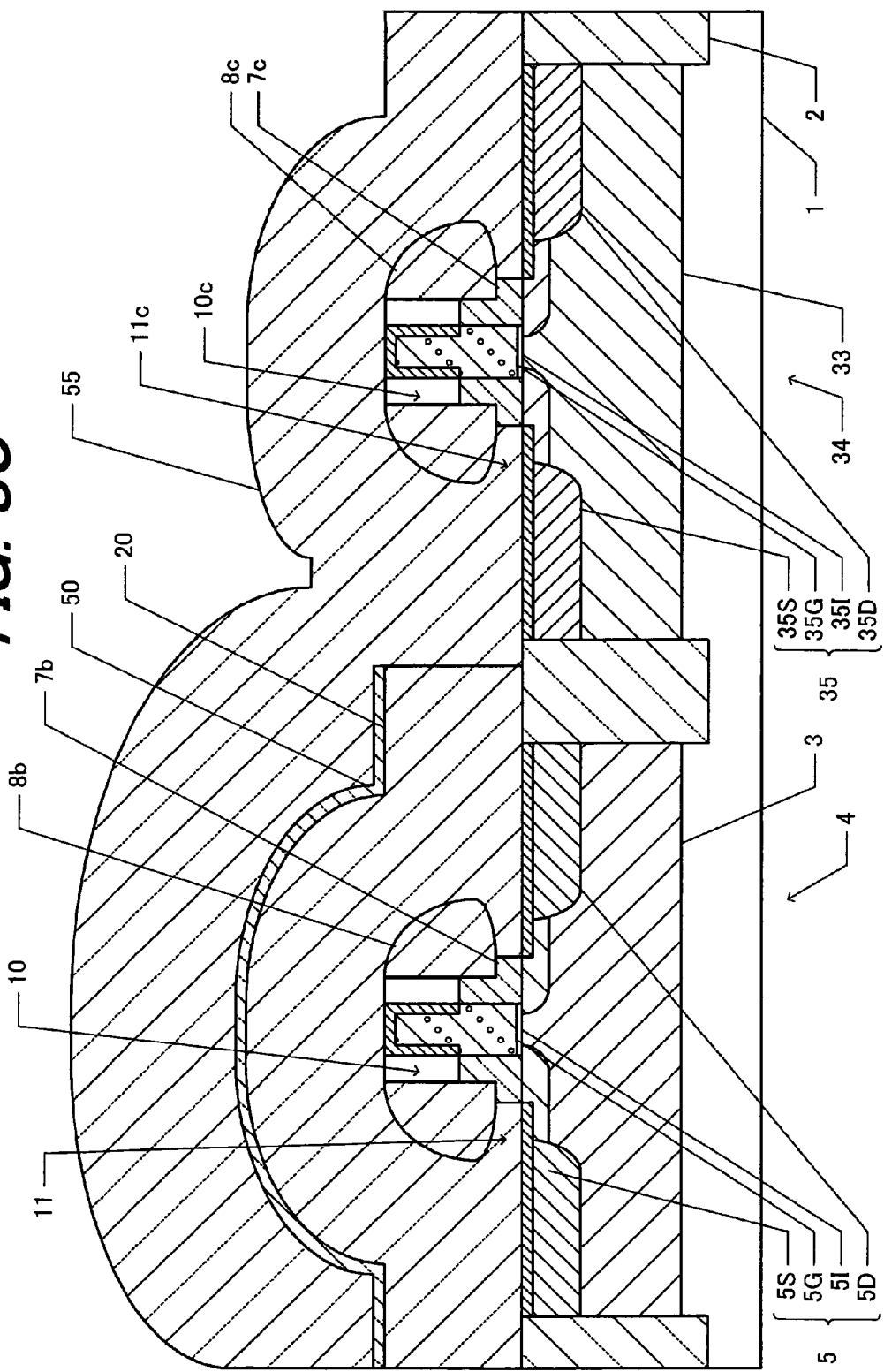

As shown in FIG. 8C, a stress control film 55 made of silicon nitride accumulating compressive stress therein and having a thickness of 100 nm is formed on the whole surface of the substrate. The stress control film 55 is deposited under the condition that the stress control film 55 is not embedded in the first cavities 10c and is embedded in the second cavities 11c.

Figure 8D:
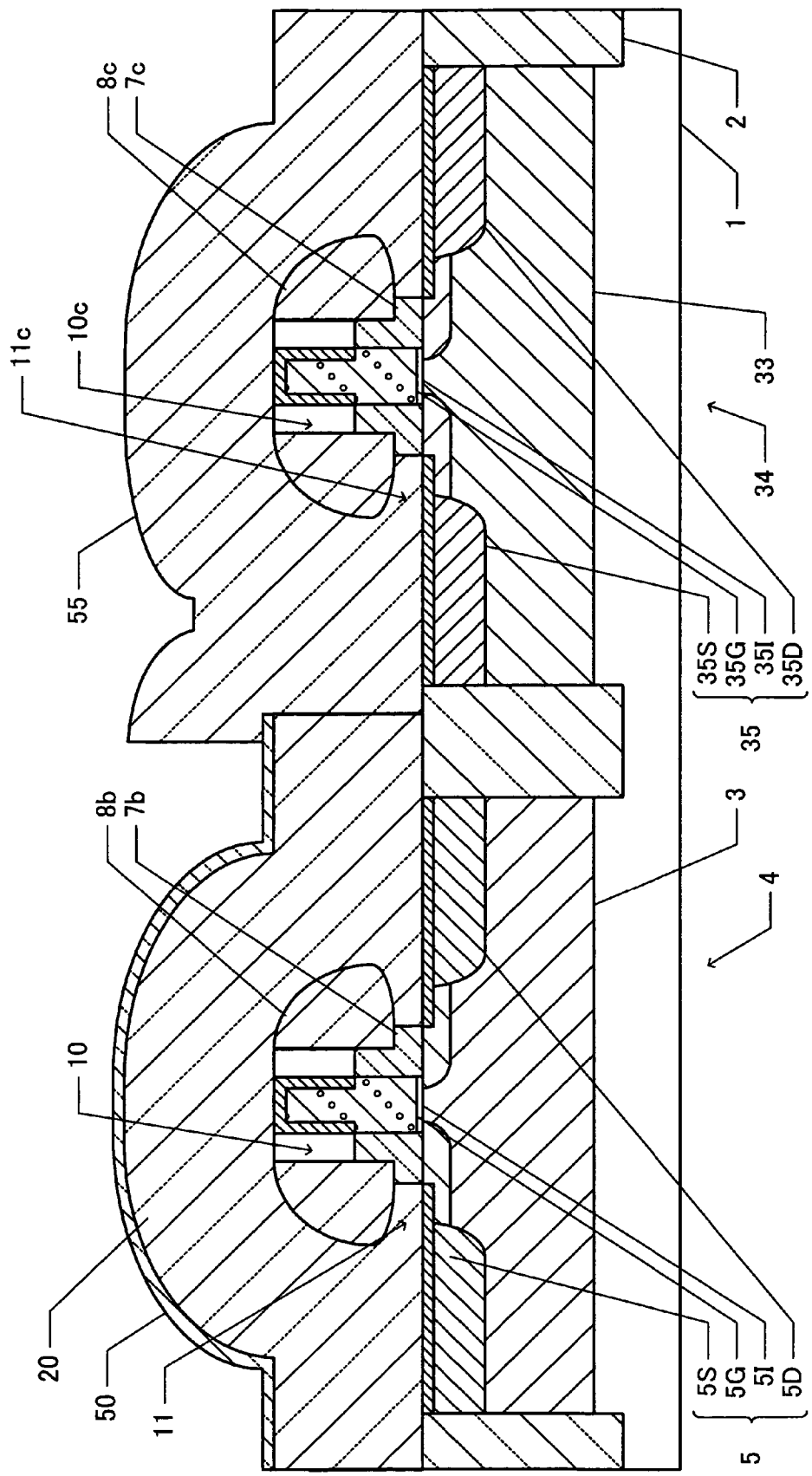

As shown in FIG. 8D, the stress control film 20 above the active region 4 formed with the n-channel transistor 5 is removed, whereas the stress control film 55 above the active region 34 formed with the p-channel transistor 35 is left. Thereafter, an interlayer insulating film 23, plugs 26, 27 and 28 and the like shown in FIG. 5I are formed. Plugs are also formed at positions corresponding to the source region 35S, drain region 35D and gate electrode 35G of the p-channel transistor 35.

Tensile stress can be applied efficiently to the channel region of the n-channel transistor 5, as in the case of the second embodiment shown in FIG. 5I. Compressive stress can be applied efficiently to the channel region of the p-channel transistor 35.

Next, a semiconductor device manufacture method according to the sixth embodiment will be described with reference to FIGS. 9A to 9G.

Figure 9A:
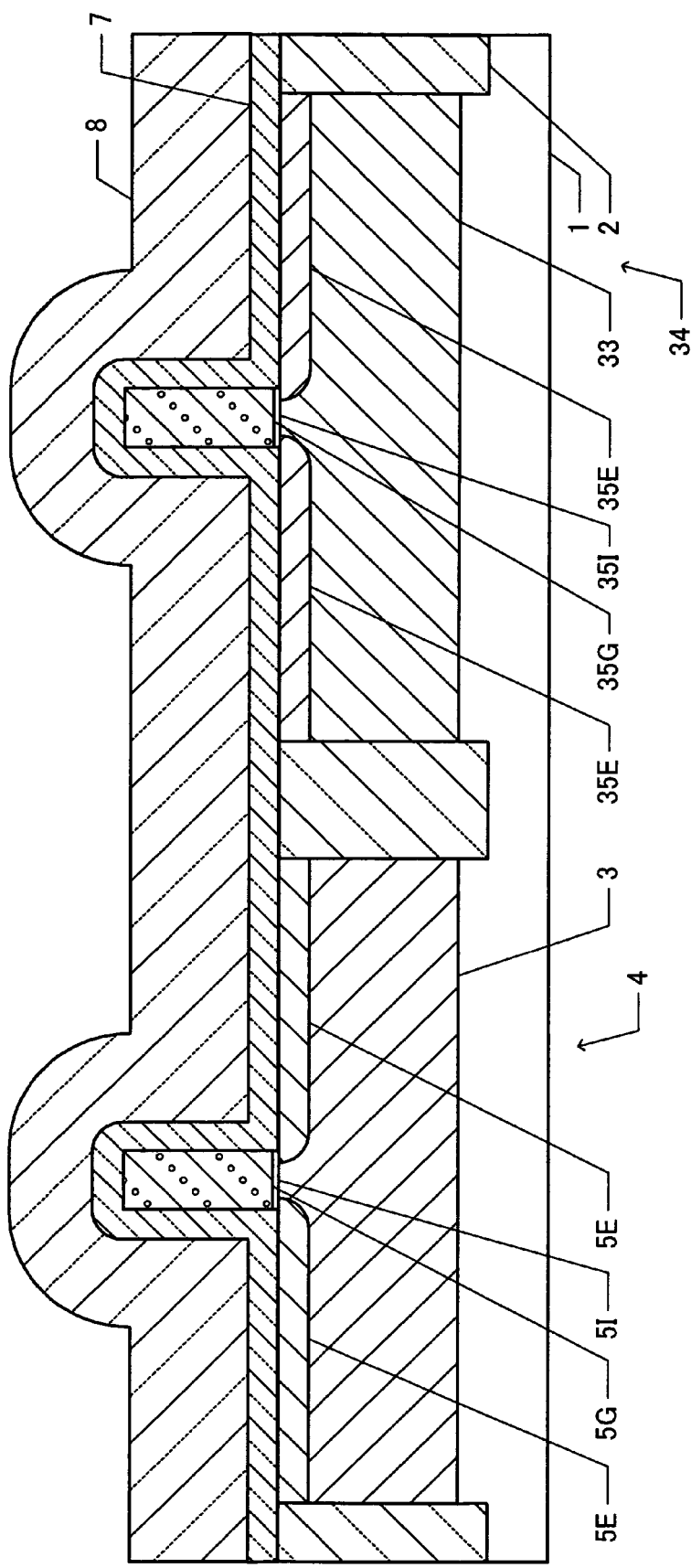

As shown in FIG. 9A, an isolation insulating film 2 is formed in the surface layer of a semiconductor substrate 1 to define active regions 4 and 34. A p-type well 3 is formed in the surface layer of one active region 4, and an n-type well 33 is formed in the surface layer of the other active region 34. The structure of the p-type active region 4 and the structure above the p-type active region are the same as those of the semiconductor device during manufacture in the manufacture method of the second embodiment shown in FIG. 5D. A gate electrode 35G and extensions 35E of a p-channel transistor are formed in the n-type active region 34. A first film 7 and a second film 8 disposed on the active region 4 cover also the active region 34 and gate electrode 35G.

Figure 9B:
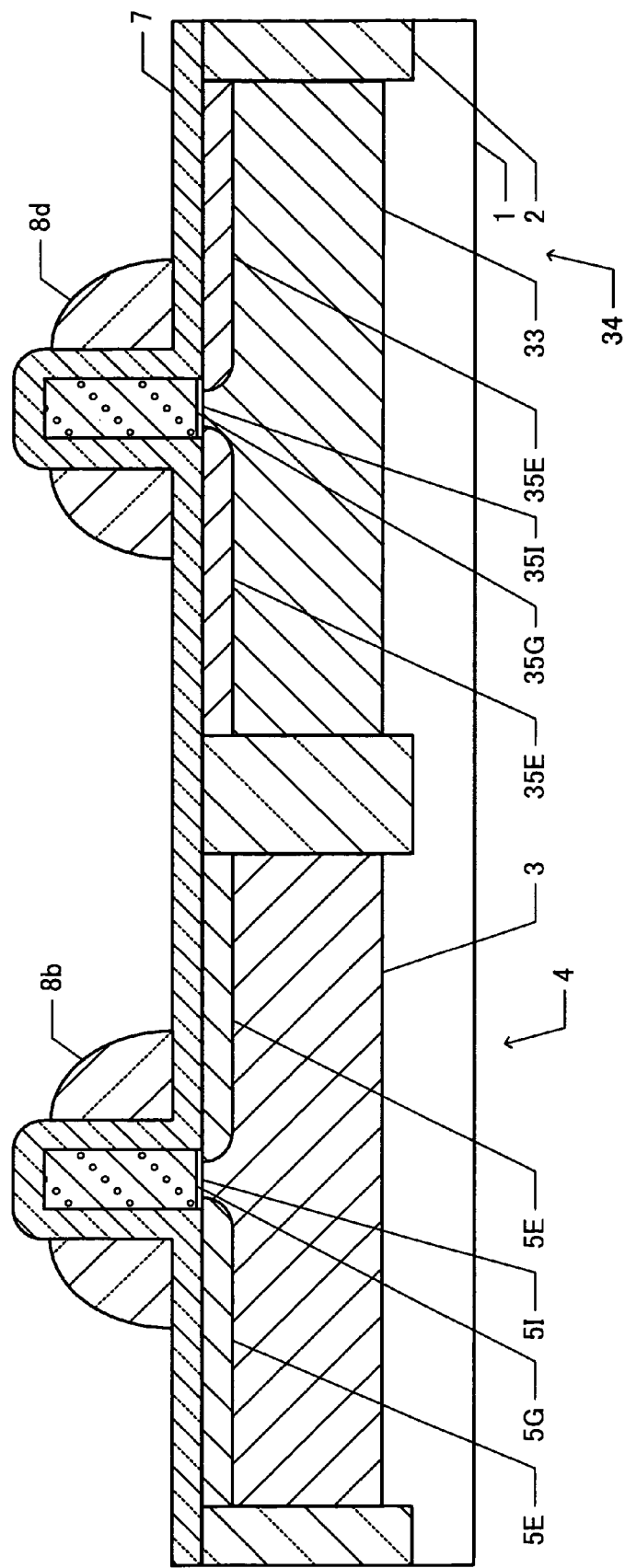

As shown in FIG. 9B, the second film 8 is anisotropically etched. This etching is performed under the same condition as that of etching the second film 8 by the manufacture method of the third embodiment shown in FIG. 6A. A portion 8b of the second film 8 is left on the sidewalls of the gate electrode 5G across the first film 7, and a portion 8d of the second film 8 is left on the sidewalls of the gate electrode 35G across the first film 7.

Figure 9C:
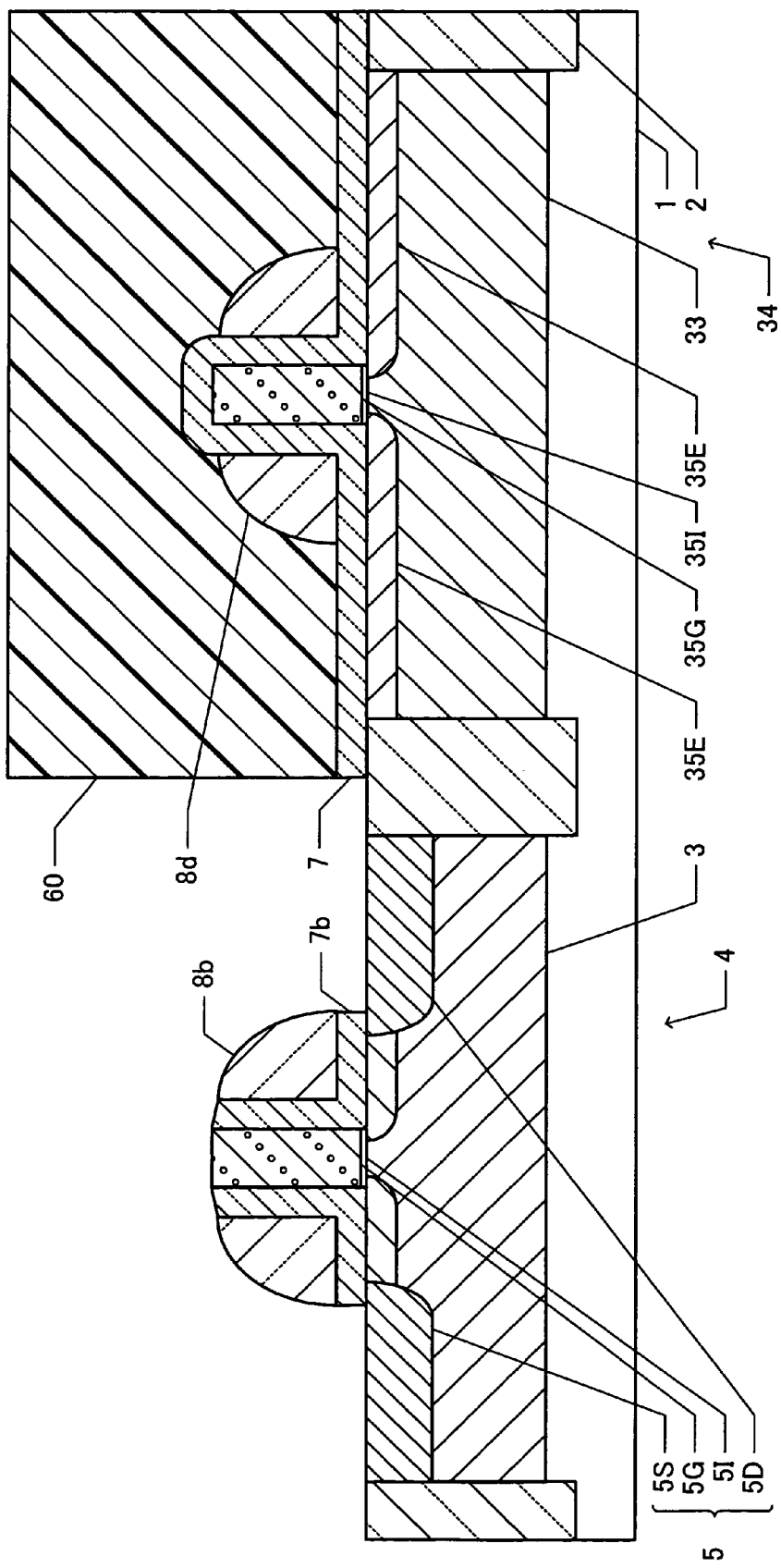

As shown in FIG. 9C, the active region 34 for the p-channel transistor is covered with a resist pattern 60. The first film 7 is anisotropically etched under the condition that the first film 7 is selectively etched relative to the second film 8b. A portion 7b of the first film 7 is therefore left between the sidewalls of the gate electrode 5G and second films 8b and between the active region 4 and second films 8b.

By using the gate electrode 5G, first films 7b and second films 8b as a mask, impurities are implanted into the surface layer of the active region 4 on both sides of the mask to form deep regions of a source region 5S and a drain region 5D. The structure of the active region 4 and the structure of regions above the active region are the same as those of the semiconductor device during manufacture in the manufacture method of the second embodiment shown in FIG. 5E.

Figure 9D:
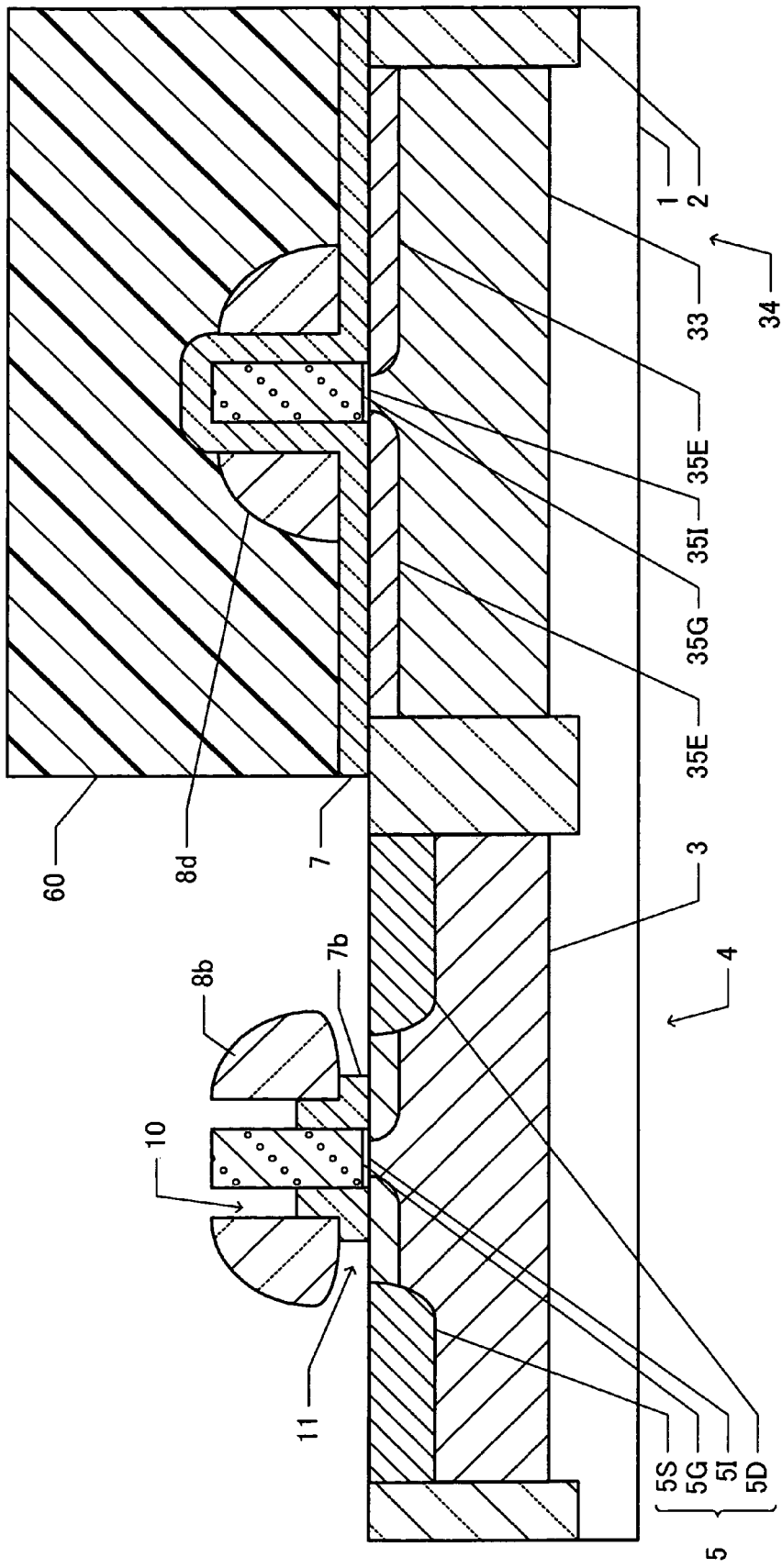

As shown in FIG. 9D, portions 7b of the first films 7 left on the active region 4 for the n-channel transistor are isotropically etched. This etching is performed by the same process as the process of etching the first film 7b by the manufacture method of the second embodiment shown in FIG. 5F. First cavities 10 and second cavities 11 are therefore formed, as in the case of the second embodiment.

As shown in FIG. 9E, the resist pattern 60 covering the active region 34 for the p-channel transistor is removed, and the active region 4 for the n-channel transistor is newly covered with a resist pattern 62.

As shown in FIG. 9F, the first films 7 on the active region 34 are isotropically etched. This etching condition is the same as that of etching the first film 7 by the manufacture method of the fourth embodiment shown in FIG. 7B. A portion 7d of the first film 7 is left on the sidewalls of the gate electrode 35G, and second cavities 11d are formed between the second films 8d and the surface of the active region 34. An opening portion of the second cavity 11d is narrower than that of the second cavity 11 on the active region 4 for the n-channel transistor. After the first film 7 is etched, impurities are implanted into the surface layer of the active region 34 to form deep regions of a source region 35S and a drain region 35D. The resist pattern 62 is thereafter removed.

Figure 9G:
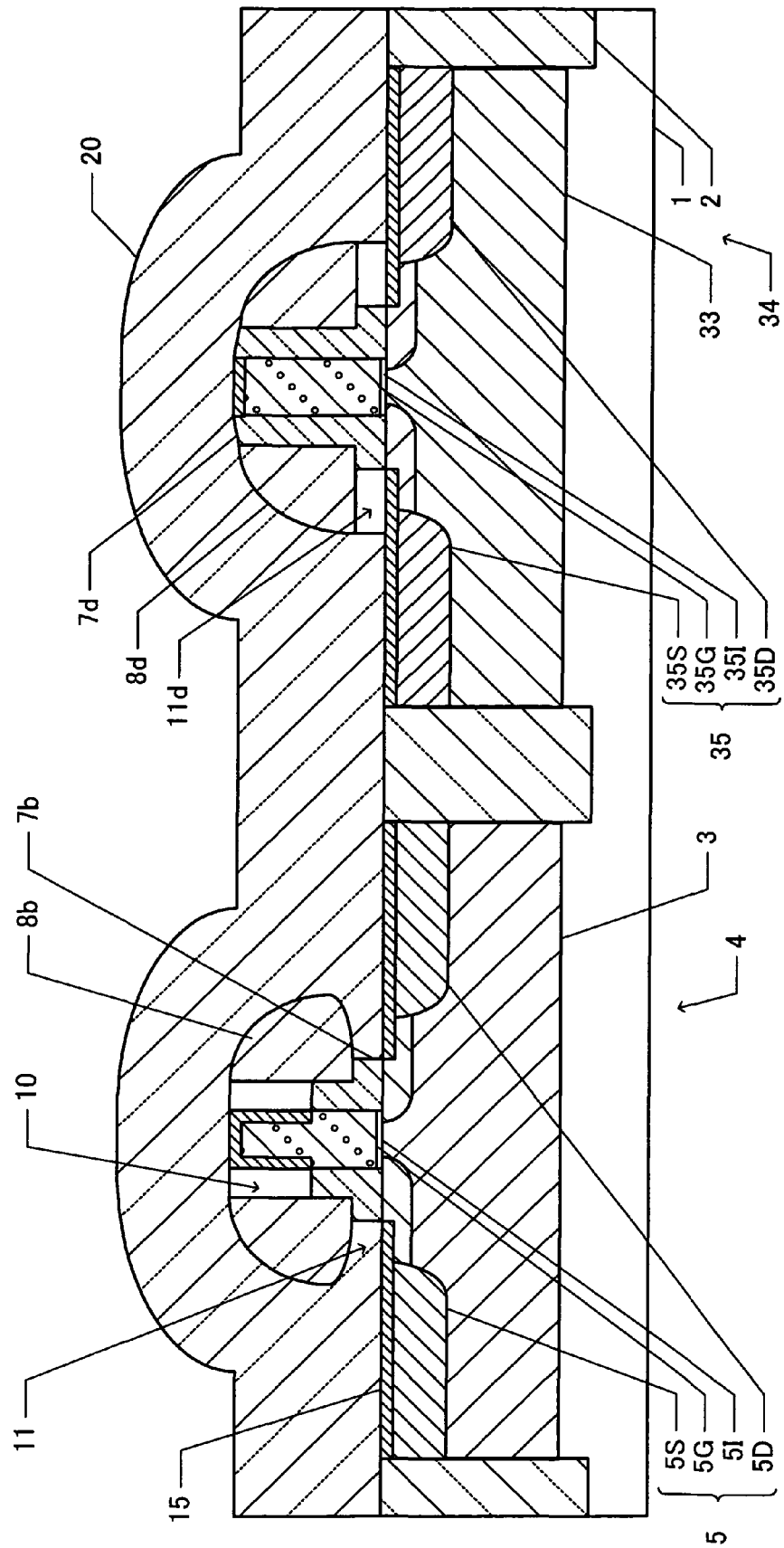

As shown in FIG. 9G, a stress control film 20 made of silicon nitride accumulating tensile stress therein and having a thickness of 100 nm is formed on the whole surface of the substrate. The stress control film 20 is formed under the condition that the stress control film 20 is embedded in the second cavities 11 on the active region 4 for the n-channel transistor, is not embedded in the first cavities 10, and is not embedded in the second cavities 11d on the active region 34 for the p-channel transistor. An opening portion of the second cavity 11d on the active region 34 for the p-channel transistor is narrower than that of the second cavity 11 on the active region 4 for the n-channel transistor. The above-described film forming condition can therefore be found.

In the sixth embodiment, the n-channel transistor 5 has the same structure as that of the n-channel transistor 5 of the second embodiment shown in FIG. 5I. The p-channel transistor 35 has the same structure as that of the transistor which is formed by reversing the conductivity type of the n-channel transistor 5 of the fourth embodiment shown in FIG. 7D and changing the stress of the stress control film 20A to tensile stress.

In the fifth embodiment shown in FIG. 8D, the stress control film 20 covering the n-channel transistor 5 is required to be formed separately from the stress control film 55 covering the p-channel transistor 35. In contrast, in the sixth embodiment, both the n-channel transistor 5 and p-channel transistor 35 are covered with the same stress control film 20 accumulating tensile stress therein. As the p-channel transistor 35 is covered with the stress control film 20 accumulating tensile stress therein, tensile stress is applied to the channel region, so that channel mobility is lowered. In the sixth embodiment, the second cavity 11d corresponds to the third portion R3 shown in FIG. 1. Since the third portion R3 is a cavity, tensile stress to be applied to the channel region can be reduced. It is therefore possible to suppress the characteristics of the p-channel transistor 35 from being degraded.

In the sixth embodiment, the conductivity type of each transistor may be reversed and the stress control film 20 may accumulate compressive stress therein. With this structure, compressive stress can be induced efficiently in the channel region of the p-channel transistor, and compressive stress to be applied to the channel region of the n-channel transistor can be reduced.

In the above-described embodiments, although four portions of the sidewall structure disposed on the sidewalls of the gate electrode of a transistor are made of one of silicon oxide, silicon nitride and a cavity, other materials having different Young's moduli may also be used. Although the silicon nitride film is used as the stress control film, other insulating films may also be used which accumulate tensile stress or compressive stress therein.

The present invention has been described in connection with the preferred embodiments. The invention is not limited only to the above embodiments. It will be apparent to those skilled in the art that other various modifications, improvements, combinations, and the like can be made.

I claim:

1. A semiconductor device comprising:
   a semiconductor substrate including a first active region of a first conductivity type;
   a first transistor including a gate electrode disposed over the first active region, a source region and a drain region of a second conductivity type opposite to the first conductivity type formed in the first active region on both sides of the gate electrode;
   a first sidewall structure disposed on sidewalls of the gate electrode of the first transistor and on a surface of the first active region on both sides of the gate electrode; and
   a first stress control film accumulating stress therein and covering the gate electrode of the first transistor, the first sidewall structure and the first active region,
   wherein:
   the first sidewall structure comprises a first portion extending along partial upper sidewalls of the gate electrode, a second portion extending from partial lower sidewalls of the gate electrode to partial surfaces of the first active region, a third portion extending along partial surfaces of the first active region outside the second portion, and a fourth portion facing the sidewalls of the gate electrode and an upper surface of the first active region across the first to third portions, and a Young's modulus of the first portion is lower than a Young's modulus of the third portion, and a Young's modulus of the first portion is lower than a Young's modulus of the second portion;
   the source and drain regions of the first transistor is an n-type and the stress in the first stress control film is tensile stress, or the source and drain regions of the first transistor is a p-type and the stress in the first stress control film is compressive stress;
   an edge of the second portion far from the gate electrode is further from the gate electrode than a surface of the fourth portion facing the sidewall of the gate electrode, and
   Young's modulus of the third portion is higher than Young's modulus of the second portion on the partial lower sidewalls of the gate electrode, and is higher than Young's modulus of the second portion further from the gate electrode than the surface of the fourth portion facing the sidewall of the gate electrode.

2. The semiconductor device according to claim 1, wherein the first portion is a cavity.

3. The semiconductor device according to claim 2, wherein an average thickness of the third portion is thicker than an average thickness of the first portion.

4. The semiconductor device according to claim 1, further comprising:
a second active region of the second conductivity type formed in the semiconductor substrate;
a second transistor including a gate electrode disposed over the second active region and intersecting the second active region, a source region and a drain region of the first conductivity type formed in the second active region on both sides of the gate electrode;
a second sidewall structure disposed on sidewalls of the gate electrode of the second transistor and on a surface of the second active region on both sides of the gate electrode; and
a second stress control film accumulating stress therein, a sign of which is opposite to a sign of the stress of the first stress control film, and covering the gate electrode of the second transistor, the second sidewall structure and the second active region,
wherein the second sidewall structure comprises a first portion extending along partial upper sidewalls of the gate electrode of the second transistor, a second portion extending from partial lower sidewalls of the gate electrode of the second transistor to partial surfaces of the second active region, a third portion extending along partial surfaces of the second active region outside the second portion, and a fourth portion facing the sidewalls of the gate electrode of the second transistor and an upper surface of the second active region across the first to third portions, and a Young's modulus of the first portion is lower than a Young's modulus of the third portion.

5. The semiconductor device according to claim 1 wherein the second portion is made of silicon oxide.

6. The semiconductor device according to claim 1 wherein the third portion is filled with a first stress control film.

7. The semiconductor device according to claim 1 wherein a thickness of the third portion at an edge far from the gate electrode is thicker than a thickness of the third portion at an edge near the gate electrode.

8. The semiconductor device according to claim 7, wherein the edge far from the gate electrode is on a side opposite to the gate electrode, and the edge near the gate electrode is facing the gate electrode.

9. The semiconductor device according to claim 7, wherein the second portion and the third portion are in direct contact with the semiconductor substrate.

10. The semiconductor device according to claim 1 wherein the first portion is in contact with the second portion.

11. The semiconductor device according to claim 1 wherein a partial region of the second portion is disposed between the fourth portion and the gate electrode.

12. The semiconductor device according to claim 1 wherein the second portion on the partial surface of the first active region is in contact with the semiconductor substrate.

13. A semiconductor device comprising:
a semiconductor substrate including a first active region of a first conductivity type;
a first transistor including a gate electrode disposed over the first active region, a source region and a drain region of a second conductivity type opposite to the first conductivity type formed in the first active region on both sides of the gate electrode;
a first sidewall structure disposed on sidewalls of the gate electrode of the first transistor and on a surface of the first active region on both sides of the gate electrode;
a first stress control film accumulating stress therein and covering the gate electrode of the first transistor, the first sidewall structure and the first active region,
a second active region of the second conductivity type formed in the semiconductor substrate;
a second transistor having a gate electrode disposed on the second active region and intersecting the second active region, a source region and a drain region of the first conductivity type formed in a surface layer of the second active region on both sides of the gate electrode; and
a second sidewall structure disposed on sidewalls of the gate electrode of the second transistor and on a surface of the second active region on both sides of the gate electrode,
wherein:
the first sidewall structure comprises a first portion extending along partial upper sidewalls of the gate electrode, a second portion extending from partial lower sidewalls of the gate electrode to partial surfaces of the first active region, a third portion extending along partial surfaces of the first active region outside the second portion, and a fourth portion facing the sidewalls of the gate electrode and an upper surface of the first active region across the first to third portions, and a Young's modulus of the first portion is lower than a Young's modulus of the third portion;
the source and drain regions of the first transistor is an n-type and the stress in the first stress control film is tensile stress, or the source and drain regions of the first transistor is a p-type and the stress in the first stress control film is compressive stress;
the first stress control film covers also the gate electrode of the second transistor, the second sidewall structure and the second active region; and
wherein the second sidewall structure comprises a first portion extending along partial upper sidewalls of the gate electrode of the second transistor, a second portion extending from partial lower sidewalls of the gate electrode of the second transistor to partial surfaces of the second active region, a third portion extending along partial surfaces of the second active region outside the second portion, and a fourth portion facing the sidewalls of the gate electrode of the second transistor and an upper surface of the second active region across the first to third portions, and a Young's modulus of the first portion is higher than a Young's modulus of the third portion.

14. The semiconductor device according to claim 13, wherein the third portion of the second sidewall structure is a cavity.

15. The semiconductor device according to claim 13, wherein an average thickness of the third portion of the first sidewall structure is thicker than an average thickness of the third portion of the second sidewall structure.

16. The semiconductor device according to claim 13, wherein the first portion and the second portion of the second sidewall structure are made of same material.

* * * * *